United States Patent
Bhuvanagiri et al.

(10) Patent No.: US 7,917,569 B2
(45) Date of Patent: Mar. 29, 2011

(54) DEVICE FOR IMPLEMENTING A SUM OF PRODUCTS EXPRESSION

(75) Inventors: Aditya Bhuvanagiri, Guntur (IN); Rakesh Malik, Noida (IN); Nitin Chawla, Noida (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 1000 days.

(21) Appl. No.: 11/254,935

(22) Filed: Oct. 20, 2005

(65) Prior Publication Data

US 2006/0153321 A1 Jul. 13, 2006

(30) Foreign Application Priority Data

Oct. 20, 2004 (IN) .......................... 2054/DEL/2004

(51) Int. Cl.
*G06F 7/00* (2006.01)
(52) U.S. Cl. ...................................................... 708/603
(58) Field of Classification Search .......... 708/300–320, 708/209, 620, 670, 603; 375/220–240
See application file for complete search history.

(56) References Cited

U.S. PATENT DOCUMENTS

| | | | | |
|---|---|---|---|---|
| 5,479,363 A | * | 12/1995 | Willson et al. ................ | 708/319 |
| 5,886,914 A | * | 3/1999 | Sugawa et al. ................ | 708/319 |
| 6,590,931 B1 | * | 7/2003 | Wittig ........................... | 375/231 |
| 7,016,926 B2 | * | 3/2006 | Jang et al. ..................... | 708/319 |
| 2004/0170223 A1 | * | 9/2004 | Chiueh et al. ................. | 375/229 |
| 2007/0297500 A1 | * | 12/2007 | Guo et al. ..................... | 375/240 |

OTHER PUBLICATIONS

IEEE Transactions on Circuits and Systems-11: Analog and Digital Signal Processing, vol. 43, No. IO, Oct. 1996, "Subexpression Sharing in Filters Using Canonic Signed Digit Multipliers" Richard I. Hartley, Member, IEEE.*

* cited by examiner

*Primary Examiner* — Lewis A Bullock, Jr.
*Assistant Examiner* — Kevin Hughes
(74) *Attorney, Agent, or Firm* — Lisa K. Jorgenson; Allen, Dyer, Doppelt, Milbrath & Gilchrist, P.A.

(57) ABSTRACT

A device for implementing a sum-of-products expression includes a first set of 2-input Shift-and-Add (2SAD) blocks receiving a coefficient set/complex sum-of-products expression for generating a first set of partially optimized expression terms by applying recursive optimization therein, a second set of 1-input Shift-and-Add (1SAD) blocks receiving response from the 2SAD blocks for generating a second set of partially optimized expression terms by applying vertical optimization therein, a third set of 2SAD blocks receiving recursively and vertically optimized response from the first set of 2SAD block and the second set of 1SAD blocks for generating a third set of partially optimized expression terms by applying horizontal optimization therein, a fourth set of 2SAD blocks receiving response from the blocks for generating a fourth set of partially optimized expression terms by applying decomposition and factorization, and a fifth set of 2SAD blocks receiving response from the fourth set of 2SAD blocks, for generating the final output.

26 Claims, 25 Drawing Sheets

Note: Parallel Input Parallel Output (PIPO) Register is called $Z^{-1}$

"z" bit left shifter
note: shifting is free of cost in parallel implementations,
(cost here means hardware component cost)

direct form of coefficient bank

Note: Number of adders required are 3 node- can be an adder/subtractor

Note: Number of adders required are 2

Optimization 2
(vertical optimization)

Optimization 3
(horizontal optimization)

Optimization 1:

Note*: If suppose Ck, Cj are repeated odd fundamentals in the odd fundamental set then only one of Ck, Cj is left in odd fundamental set and a recursive subexpression Sk+Sj is formed

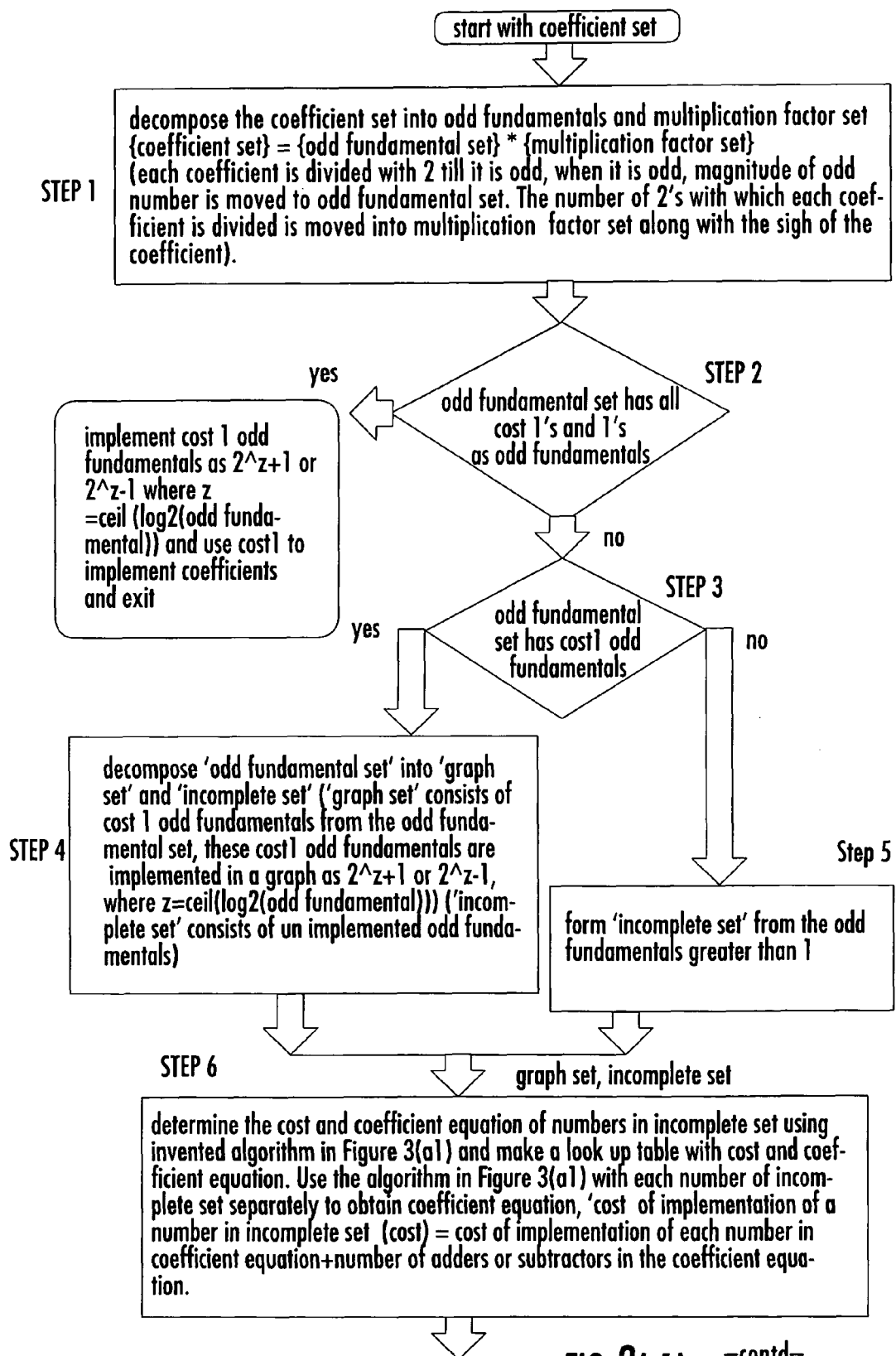
FIG. 3(c1) —contd—

Note *:Adder distance:
Adder distance 1 of the selected number from incomplete set = fundamental from the existing graph set + a power of 2

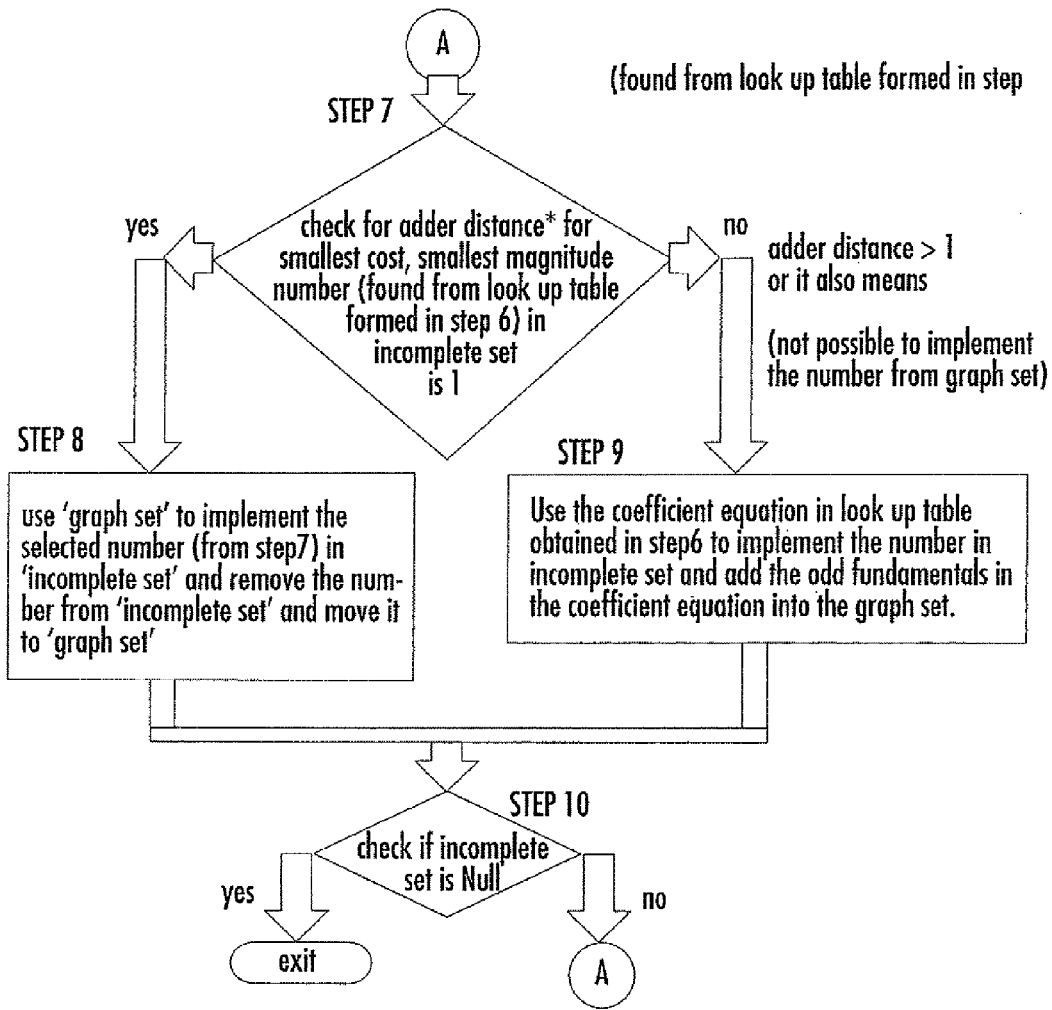
FIG. 3 (C1)-1

DEVICE FOR IMPLEMENTING A SUM OF PRODUCTS EXPRESSION

FIELD OF THE INVENTION

The present invention relates to minimized area implementation of a sum of products expression.

BACKGROUND OF THE INVENTION

The implementation of a Sum of Products (SOP) expression can be used to realize signal-processing applications on hardware. A SOP implementation is hereby discussed with reference to a hardware realization of a digital filter. A digital filter is an electronic circuit processing discrete signal samples to perform a desired transfer function operation on the discrete signal samples. The digital filter is a Finite Impulse Response (FIR) or Infinite Impulse Response (IIR) filter.

The following components are used in the digital filter implementation.

Unit sample delay (11): A unit sample delay ($Z^{-1}$) is shown in FIG. 1(a). A unit sample delay is a Parallel In Parallel Out (PIPO) register as it captures the sample at its input on the next positive clock edge.

Multiplier (12): Takes in an input 'x' and gives a multiplied output 'y'='a*x', where 'a' is the multiplicand. Its symbol is a triangle with a multiplicand by its side as shown in FIG. 1(b).

'P1' bit adders (13): Takes in two inputs each of width 'p1' bits and gives an added output of 'p1' bits. Hence this adder is called the 'p1' bit parallel adder and its symbol is '+' in a circle as shown in FIG. 1(b).

'P1' bit subtractor (15): Takes in two inputs each of width 'p1' bits and subtracts one output from the other and gives an output of 'p1' bits. Hence this subtractor is called as the 'p1' bit parallel subtractor and its symbol is shown in a circle with '+' in it and '−' on one of the inputs as shown in FIG. 1(b).

Parallel shifter (14): Takes in an input 'x' and gives a 'z' bit left shifted output. Suppose 'x=101' and 'z=2' then 'y=10100', then its symbol is a line with '<<z' on it (where 'z' can be any positive number) as shown in FIG. 1(b).

The working of unit sample delay is evident from the timing diagram shown in FIG. 1(c). The samples X0, X1, X2 . . . X7 at the input of unit sample delay in FIG. 1(c) appear as delayed by one Clock (Clk) period as they are captured by the next positive edge of the Clk. The transfer function H (Z) of a FIR filter has the generic form as given in equation (2a);

$$H(Z) = \sum_{k=0}^{N} b_k z^{-k}, \quad (2a)$$

where $b_K$ represents the coefficients, and $z^{-k}$ represents delay of k clock cycles.

The equation of a FIR filter is given below:

$$y(n) = \sum_{k=0}^{N} b_k x(n-k), \quad (2b)$$

where y(n) is the output and x(n−K) is the delayed input.

The FIR filter has different types of implementations in hardware. Two of the important implementations of the FIR filter are the direct form of coefficient bank implementation as shown in FIG. 2(a) and the transposed form of implementation as shown in FIG. 2(b). The direct form of the FIR filter has an input X connected to the first unit sample delay. Unit sample delays (11) are connected serially to each other. Taps $S_0$ to $S_N$ obtained from unit sample delays (11) are connected to respective coefficient multipliers (12) $b_0$ to $b_N$. The output of the multipliers (12) is added through a plurality of adders (13,15) to form the output Y of the filter.

The transposed form of the FIR filter (2b) has the input X connected to the plurality of coefficient multipliers $b_0$ to $b_N$ (12) resulting in taps $S_0$ to $S_N$. The taps $S_0$ to $S_N$ are connected to the plurality of unit sample delays (11) and adders (13,15) to form the output Y of the filter.

Given below is the equation of the IIR filter:

$$H(Z) = \left(\sum_{m=0}^{M} b_m z^{-m}\right) \bigg/ \left(1 - \sum_{l=1}^{L} a_l z^{-1}\right); \quad (2c)$$

where H (Z) is the transfer function, $b_m$ and $a_l$ are the coefficients and $z^{-k}$ represent a delay of k clock cycles.

The equation of the IIR filter can also be written as in equation (2d);

$$y(n) = \sum_{l=1}^{L} a_l y(n-1) + \sum_{m=0}^{M} b_m x(n-m), \quad (2d)$$

where y(n) is the output, y(n−1) is the delayed output and x(n−m) is the delayed input.

The implementation of a coefficient is the implementation of a number in hardware. Hence the term coefficient and number are used interchangeably in the specification.

The structure of a direct and transposed form IIR filter is shown in FIG. 2(c). The direct form structure has a plurality of unit sample delays (11), and two sets of direct form coefficient banks (1) formed by plurality of adders (13,15) and plurality of the multipliers (12) connected to the taps. The transposed form of the IIR filter has plurality of unit sample delays (11), and two sets of transposed form coefficient banks (1) formed by a plurality of adders (13,15) and plurality of the multipliers (12) connected to the taps as shown in FIG. 2(c). The parallel direct or transposed form of coefficient bank is the area consuming part in the parallel digital filter implementations. An existing way of implementing the parallel direct or transposed form of coefficient bank using the shift (12) and add (13,15) has been described in FIG. 2(b). A left shift is '0' cost in parallel implementations as it needs only appending lines set at '0' on the left of the parallel bus. The remaining part of shift (12) and add (13,15) implementation comprises adders. The implementation of parallel multipliers using shift and add is shown in FIG. 2(d).

An existing method for implementing the direct form of coefficient bank is described as follows. The existing method of implementation of direct form of coefficient bank has two parts, part 1 is an algorithm shown in FIG. 2(e), which takes coefficients taps as input and gives the equation of direct form of coefficient bank and horizontal subexpressions as the output, and part 2 is the generalized structure shown in FIG. 2(g), which is obtained by mapping the equation of the direct form of coefficient bank, and horizontal sub-expressions onto hardware.

The method is explained by using coefficient bank implementation for a given example.

Assuming that the example coefficients of an FIR filter are given by, Set 1={−79, 1044, −5890, 27916, 49362, −8382, 1628, −154, 63, 126}. The equation form of the direct form of coefficient bank for the example is as given below:

$$Y=[-79]S0+[1044]S1+[-5890]S2+[27916]S3+\\ [49362]S4+[-8382]S5+[1628]S6+[-154]S7+[S3]\\ S8+[126]S9 \quad (2e)$$

FIG. 2(*f*1) shows the direct form of implementation of the example FIR filter. Structure (1) is the direct form of coefficient bank, that comprises unit sample delays (11), multipliers and adders (12,13,15). The execution of the existing method (FIG. 2(*e*)) is explained with reference the coefficients of Set 1.

Step 1: This step illustrates the conversion of coefficients into Canonical Signed Digit (CSD) representation. Here the value of 'i' is −1.
−79=i0i0001;    1044=10000010100;
−5890=i01001000000i0;    27916=100i0i0100010i00
49362=10i0000010i010010;    −8382=i0000i01000010;
1628=10i010i00i00;    −154=i0i010i0;    63=100000i;
126=100000i0

The direct form of coefficient bank with CSD representation of coefficients is as given below:

$$Y=(2^{\wedge}0-2^{\wedge}4-2^{\wedge}6)S0+(2^{\wedge}2+2^{\wedge}4+2^{\wedge}10)S1+(-2^{\wedge}1+2^{\wedge}8+\\ 2^{\wedge}11-2^{\wedge}13)S2+(-2^{\wedge}2+2^{\wedge}4+2^{\wedge}8-2^{\wedge}10-2^{\wedge}12+2^{\wedge}15)\\ S3+(2^{\wedge}1+2^{\wedge}4-2^{\wedge}6+2^{\wedge}8-2^{\wedge}14+2^{\wedge}16)S4+(2^{\wedge}1+\\ 2^{\wedge}6-2^{\wedge}8-2^{\wedge}13)S5+(-2^{\wedge}2-2^{\wedge}5+2^{\wedge}7-2^{\wedge}9+2^{\wedge}11)S6+\\ (-2^{\wedge}1+2^{\wedge}3-2^{\wedge}5-2^{\wedge}7)S7+(-2^{\wedge}0+2^{\wedge}6)S8+(-261+\\ 2^{\wedge}7)S9 \quad (2f1)$$

or $$Y=S0-S8+2(-S2+S4+S5-S7-S9+2(S1-S3-S6+2(S7+2\\ (-S0+S1+S3+S4+2(-S6-S7+2(-S0-S4+S5+S8+2\\ (S6-S7+S9+2(S2+S3+S4-S5+2(-S6+2(S1-S3+2\\ (S2+S6+2(-S3+2(-S2-S5+2(-S4+2(S3+2\\ (S4)))))))))))))) \quad (2f2)$$

The number of adders required to implement equation (2f2) are 38. Hereafter, Adders/Subtractors are referred as adders for the ease of explanation.

Step 2: Horizontal subexpressions are formed from the CSD representation of coefficients. Table 1 shows the horizontal optimization for the example. From Table1, it is seen that subexpression in row $2^{\wedge}0$ is −(S0−S8), and in row $2^{\wedge}6$ it is (S0−S8). Since S0−S8 is

TABLE 1

Showing Horizontal Optimization

| | S9 | S8 | S7 | S6 | S5 | S4 | S3 | S2 | S1 | S0 |
|---|---|---|---|---|---|---|---|---|---|---|
| $2^{\wedge}0$ | | ⎛ | | | | | | | | ⎞ |
| $2^{\wedge}1$ | i | | i | | | | ⎛ | 1 | | ⎞ |
| $2^{\wedge}2$ | | | | i | | | | ⎛ | i | ⎞ |
| $2^{\wedge}3$ | | | | 1 | | | | | | |
| $2^{\wedge}4$ | | | | | | ⎛ | | ⎞ | 1 | i |
| $2^{\wedge}5$ | | | | i | i | | | | | |
| $2^{\wedge}6$ | | ⎛ | | | 1 | i | | | | ⎞ |
| $2^{\wedge}7$ | 1 | | i | 1 | | | | | | |
| $2^{\wedge}8$ | | | | | | ⎛ | | ⎞ | | |
| $2^{\wedge}9$ | | | | i | | | | | | |
| $2^{\wedge}10$ | | | | | | | ⎛ | | i | ⎞ |
| $2^{\wedge}11$ | | | | 1 | | | | 1 | | |
| $2^{\wedge}12$ | | | | | | | | i | | |
| $2^{\wedge}13$ | | | | | | i | | | | i |
| $2^{\wedge}14$ | | | | | | i | | | | |
| $2^{\wedge}15$ | | | | | | | 1 | | | |
| $2^{\wedge}16$ | | | | | | 1 | | | | |

⎛ ⎞ → Horizontal subexpressions present in two 'rows', it is called as horizontal subexpression.

Similarly S1−S3, −S2+S5, S3+S4 are other horizontal subexpressions. The equation of the direct form of coefficient bank of the example after horizontal optimization is:

$$Y=X1+2(X3+S4-S7-S9+2(X2-S6+2(S7+2(-S0+S1+\\ X4+2(-S6-S7+2(-X1-S4+S5+2(S6-S7+S9+\\ 2(-X3+X4+2(-S6+2(X2+2(S2+S6+2(-S3+\\ 2(-S2-S5+2(S4+2(S3+2(S4)))))))))))))) \quad (2g).$$

The equation can also be written as equation 2(i) for showing hardware mapping.

$$Y=X1+2(E1+2(E2+2(S7+2(E3+2(-E4+2(E5+2(E6+2\\ (E7+2(-S6+2(X2+2(E8+2(-S3+2(-E9+2(-S4+2\\ (S3+2(S4)))))))))))))) \quad (2i),$$

where the expressions E1=X3+S4−S7−S9, E2=X2−S6, E3=−S0+S1+X4, E4=S6+S7, E5=−X1−S4+S5, E6=S6−S7+S9, E7=−X3+X4, E8=S2+S6, E9=S2+S5, and horizontal subexpressions X1=S0−S8, X2=S1−S3, X3=−S2+S5, X4=S3+S4. The number of adders required to implement the equation (2i) is 34.

The structure of the direct form of coefficient bank from the existing method of implementations for the above example is shown in FIG. 2 (*f*2). In FIG. 2(*f*2) substructures SS [X1 to X4] show the hardware mapping of horizontal subexpressions X1 to X4, substructure SS [E1 to E9] are the hardware mapping of the expressions E1 to Ep and substructure SS [Y] is the hardware mapping of the equation Y. The generalized structure of the direct form of coefficient bank from the existing method of implementations is shown in FIG. 2 (*g*), where the substructures SS [X1 to Xm] show the hardware mapping of horizontal subexpressions X1 to Xm, substructures SS [E1 to Ep] are the hardware mapping of expressions and E1 to Ep and SS [Y] is the hardware mapping of the equation.

FIG. 2(*i*1) shows the transposed form of implementation of the example FIR filter. Structure (2) is the transposed form of coefficient bank implementation. Individual equations for the transposed form implementation of the example coefficient bank are:

$$S0=-79X, S1=1044X, S2=-5890X, S3=27916X,\\ S4=49362X, S5=-8382X, S6=1628X, S7=-154X,\\ S8=63X, S9=126X.$$

The execution of the steps in the existing method (FIG. 2(*h*)) are explained below.

Step 1: Conversion of coefficients into Canonical Signed Digit (CSD) or any other representation. The conversion of individual coefficients to CSD with reference to Set 1 is as given below:

$$S0=-79X=(i0i0001)X$$

$$S1=1044X=(10000010100)X$$

$$S2=-5890X=(i01001000000i0)X$$

$$S3=27916X=(100i0i0100010i00)X$$

$$S4=49362X=(10i0000010i010010)X$$

$$S5=-8382X=(i0000i01000010)X$$

$$S6=1628X=(10i010i00i00)X$$

$$S7=-154X=(i0i010i0)X$$

$$S8=63X=(100000i)X$$

$$S9=126X=(100000i0)X$$

Step 2: From the vertical subexpression, form the CSD representation of coefficients. Table 2 shows the vertical subexpressions for the above stated example. In Table 2, the expression $(2^{\wedge}-2^{\wedge}6)$ is present in column S0 and in column S8 as $-(2^{\wedge}0-2^{\wedge}6)$. The expression is also present in columns S3 and S9, as $(-2^{\wedge}2)(2^{\wedge}0-2^{\wedge}6)$ and $(-2^{\wedge}1)(2^{\wedge}0-2^{\wedge}6)$ respectively.

As the expression (2^0–2^6) is present in different columns, it is called vertical subexpression. Similarly (1–(2^2)) and (1+(2^3)) are other vertical subexpressions.

TABLE 2

Showing Vertical Optimization

| | S9 | S8 | S7 | S6 | S5 | S4 | S3 | S2 | S1 | S0 |
|---|---|---|---|---|---|---|---|---|---|---|
| 2^0 | | i | | | | | | | | 1 |
| 2^1 | i | | i | | | 1 | i | | | |
| 2^2 | | | | | 1 | 1 | | i | | 1 |
| 2^3 | | | 1 | | | | | | | |
| 2^4 | | | i | | | 1 | 1 | | 1 | i |
| 2^5 | | | | | | | | | | |
| 2^6 | i | 1 | | 1 | i | | | | | i |
| 2^7 | | i | | 1 | | | | | | |
| 2^8 | | | | i | 1 | | | | | |
| 2^9 | | | | i | | | | | | |
| 2^10 | | | | | | | i | | 1 | |
| 2^11 | | | | 1 | | | | | | |
| 2^12 | | | | | | | | i | | |
| 2^13 | | | | i | | | | i | | |
| 2^14 | | | | | | | | | | |
| 2^15 | | | | | | 1 | 1 | | | |
| 2^16 | | | | | | | 1 | | | |

▯ ⟶ Vertical subexpressions

Equations of the coefficients after the vertical optimization:

$$S0 = -79X = (Y1 - (2^4))X$$

$$S1 = 1044X = ((1 + (2^2) + (2^8)) * (2^2))X$$

$$S2 = -5890X = ((-1 + (2^7) + (2^{10}) * (Y2)) * (2^1))X$$

$$S3 = 27916X = ((-Y1 + (2^2) - (2^8) - (2^{10}) + (2^{13})) * (2^2))X$$

$$S4 = 49362X = ((Y3 - (2^5) * (Y2) + (2^{13}) * (Y2)) * (2^2))X$$

$$S5 = -8382X = ((1 + (2^5) * (Y2) - (2^{12})) * (2^1))X$$

$$S6 = 1628X = ((-Y3 + (2^5) * Y2 + 2^9) * (2^2))X$$

$$S7 = -154X = ((-1 + (2^2) * Y2 - (2^6)) * (2^1))X$$

$$S8 = 63X = (Y1)X$$

$$S9 = 126X = (Y1 * (2^1))X,$$

where, $Y1 = 1 - (2^6)$, $Y2 = 1 - (2^2)$, $Y3 = 1 + (2^3)$ are vertical subexpressions.

It is observed from the above analyses that the number of adders required to implement the transposed form coefficient bank is 20. For the example the vertical subexpressions are mapped into hardware as substructures SS (Y1, Y2, Y3) as shown in FIG. 2(i2). The individual equations S0 to S9 of the transposed form of coefficient bank are mapped into hardware as substructures SS (S0 to S9) as shown in FIG. 2(i2). The substructures are formed from the plurality of adders 13,15 and shifter 14.

The generalized structure of the transposed form of the coefficient bank (2) from the existing method of implementation is shown in FIG. 2(j). It is formed with substructures SS (Y1 to Ym) formed from mapping the vertical subexpressions Y1 to Ym into hardware and substructures SS (S0 to Sn) formed from mapping the individual equations S0 to Sn into hardware. The substructures are formed from the plurality of adders (13,15) and shifter (14). It is observed that the existing structure of the coefficient bank is inefficient, when high magnitude coefficients are required to be implemented.

The constraints in the existing method for SOP expression implementation are further illustrated by implementing a number with CSD representation. The CSD representation of 45=10i0i01 and structure of the CSD implementation of the number (45) is shown in FIG. 2(k1). It is observed that the number of adders required to implement 45 in CSD based implementation as in FIG. 2(k1) is 3.

In CSD implementation the input is shifted by a value of (2^z) (where 'z' is a positive number) and then added or subtracted from the other shifts of the input. Another existing way of implementation of a 45 in hardware is 9*5 and is shown in FIG. 2(k2). The number of adders required for implementing 45 as in FIG. 2(k2) is 2. The input x is multiplied by number 9 and then the result 9x is multiplied with 5 to get an output of 45x.

It is evident from the implementation of the coefficient multiplier 45 that there can be an area efficient way of implementing coefficients, so as to reduce the number of adder/subtractors in the resultant hardware. Thus, a requirement is felt for an efficient method to achieve a reduced or minimal area implementation of a Sum of Products expression.

SUMMARY OF THE INVENTION

It is an object of the present invention to provide a reduced or minimal area integrated circuit implementation of a sum-of-products expression.

It is another object of the present invention to implement a direct form of coefficient bank using the sum-of-products expression.

It is yet another object of the present invention to implement the transposed form of coefficient bank using the sum-of-products expression.

To achieve the objectives the present invention provides a device for implementing a sum-of-products expression comprising:

a first set of 2-input Shift-and-Add (2SAD) blocks receiving a first set of the coefficients for generating a first set of partially optimized expression terms by removing repeated odd fundamental coefficients and applying recursion therein to generate minimal area sum-of-products implementation a second set of 1-input Shift-and-Add (1SAD) blocks receiving a second set of the coefficient of the expression, the second set obtained as a subset of the first set of coefficients for generating a second set of partially optimized expression terms by applying vertical optimization therein, a third set of 2SAD blocks receiving a combination of a third set of the coefficients of the expression, a first subset of the first set of partially optimized expression terms and a first subset of the second set of partially optimized expression terms as inputs, for generating a third set of partially optimized expression terms by applying horizontal optimization, a fourth set of 2SAD blocks receiving a combination of a fourth set of the coefficient of the expression, a second subset of the first set of partially optimized expression terms, a second subset of the second set of partially optimized expression terms, and a first subset of the third set of partially optimized expression terms as inputs, for generating a fourth set of partially optimized expression terms by applying decomposition and factorization therein, and a fifth set of 2SAD blocks receiving the fourth set of partially optimized expression terms for providing the final output.

Further, the present invention provides a method for creating an implementation of a sum-of-products expression, comprising:

a. preparing a tabulated form of a set of coefficients,
b. locating the common factors within the tabulated form to generate vertical and/or horizontal subexpressions for area minimal realization of the sum of products expression, the method includes the preprocessing steps of;
c. simplifying the set of coefficients into an odd fundamental set and a multiplication factor set,
d. factorizing the odd fundamental set to remove repeated odd fundamental coefficients to generate optimized sum of products expression for minimal area implementation,
e. forming a common factor set comprising numbers that correspond to $2^n(+/-)1$, the highest value in the set being minimally greater than the highest value in the odd fundamental set; and the odd fundamental set comprising minimized values of repeated odd fundamental coefficients,
f. decomposing each element of the odd fundamental set into a quotient, a remainder, and a common factor, the common factor being selected from the common factor set for providing the minimum absolute value of the remainder and optimal value of quotient,
g. merging the quotient and remainder sets with the multiplication factor set to generate a modified coefficient set, and
h. recursively optimizing the modified coefficient set by applying steps 'c' through 'g' until the smallest factor set of coefficients is obtained to thereby generate the optimized sum-of-products expression for minimal area implementation.

BRIEF DESCRIPTION OF THE DRAWINGS

The invention will now be described with reference to the accompanying drawings.

FIG. 2(f2) illustrates the existing structure of direct form of coefficient bank with Canonical Signed FIG. 2(f3) illustrates the existing structure of direct form of coefficient bank for a given example as in the prior art. Digit (CSD) representation of coefficients for a given example as in the prior art.

FIG. 2(i1) illustrates the existing transposed form structure of FIR filter for a given example as in the prior art.

FIG. 2(i2) illustrates the existing structure of-transposed form of coefficient bank for a given example as in the prior art.

FIG. 2(k1) illustrates the existing structure of a CSD represented single coefficient '45' as in the prior art.

FIG. 2(k2) illustrates another existing structure of a single coefficient '45' as in the prior art.

FIG. 3(a1)-1 is a flow chart illustrating the steps for implementing the optimization 1 block in FIG. 3(a1).

FIG. 3(a1)-2 is a flow chart illustrating the steps for implementing the optimization 2 block in FIG. 3(a1).

FIG. 3(a1)-3 is a flow chart illustrating the steps for implementing the optimization 3 block in FIG. 3(a1).

FIG. 3(a2) illustrates the method for implementation of direct form of coefficient bank with generalized equations in accordance with the instant invention.

FIG. 3(a2)-1 illustrates the convergent 2SAD (2 input Shift and Add) implementation of Subexpression R1 in accordance with the instant invention.

FIG. 3(a2)-2 illustrates the 1SAD (1 input Shift and Add) implementation of Subexpression Y1 in accordance with the instant invention.

FIG. 3(a3) illustrates the generalized structure for implementation of minimal area Sum of Products expression to realize the direct form coefficient bank.

FIG. 3(b1) illustrates the structure obtained after optimization 1 for implementation of the direct form of coefficient bank for a given example in accordance with the instant invention.

FIG. 3(b2) illustrates the structure obtained after optimization 2 for implementation of the direct form of coefficient bank for a given example in accordance with the given invention.

FIG. 3(b3) illustrates the structure obtained after expanding the cost 1 coefficients in optimization 2 in accordance with the instant invention.

FIG. 3(b4) illustrates the structure obtained after optimization 3 for implementation of the direct form of coefficient bank for a given example in accordance with the instant invention.

FIGS. 3(c1) and 3(c1)-1 illustrate the method for implementation of the transposed form of coefficient bank (Using modified sum of products expression) in accordance with the instant invention.

FIG. 3(c2) illustrates the method for realization of the transposed form of coefficient bank with generalized equations in accordance with the instant invention.

FIG. 3(c3) illustrates the generalized structure for implementation of the minimal area Sum of Products expression to realize the transposed form coefficient bank.

DETAILED DESCRIPTION OF THE PREFERRED EMBODIMENTS

Before going into details of the method for implementation of the minimal area sum and products expression, the terms 'cost' and 'weight' are introduced as follows:

Cost: It is the hardware cost required in terms of adders to implement a number. Adder, subtractor cost is referred as 'adder cost' for ease of explanation. The cost to implement power of 2 (shifting) in parallel implementations is '0'. The cost for implementing $(2^z+1)$ or $(2^z-1)$ (where 'z' is a positive number) in parallel implementations is '1'.

Weight: Weight of the cost 0's, cost 1's and numbers greater than cost 1's in a number set is fixed as follows: Weight of cost 0 (power of 2 coefficients)=1, weight of cost 1's $((2z)+1)$ or $(2^z)-1))=2$ and weight of numbers greater than cost1's=100 (Assumed for the ease of implementation). The weight of the powers of two is fixed as '1', because it requires a single adder to connect to the elements in the number set. The weight of Cost 1 coefficients is fixed as '2'.

The present invention provides a method for generating a reduced or minimal area structure for a sum of products expression. The method has three optimization steps (optimization 1, 2 and 3) involved in reduction of the number of adders required to implement the coefficient set and is illustrated as shown in the flow chart in FIG. 3($a$1). In reference to FIG. 3($a$1), optimization 1 is illustrated in the flow chart in FIG. 3($a$1)-1; optimization 2 is illustrated in the flow chart in FIG. 3($a$1)-2; and optimization 3 is illustrated in the flow chart in FIG. 3($a$1)-3.

Before explaining the step by step execution of the method (FIG. 3($a$1)), the instant invention is explained with the help of the optimization steps applied to the input set of coefficients as follows.

The input set of coefficients is a user defined complex Sum-of-Products expression or an equation represented by a high magnitude coefficient or a number, wherein the input subexpression in the instant case is $$Y=b_0*S0+b_1*S1+b_2*S2+\ldots+b_n*Sn,$$

where $\{b_0, b_1, b_2 \ldots b_j, b_k, b_n\}$ is the predefined (user input) coefficients, and S0=X, S1=$Z^{-1}$X, S2=$Z^{-2}$X ... Sn=$Z^{-n}$X. (Here X is a variable and $Z^{-n}$ represents unit sample delay)

Optimization 1

Figure 1A:
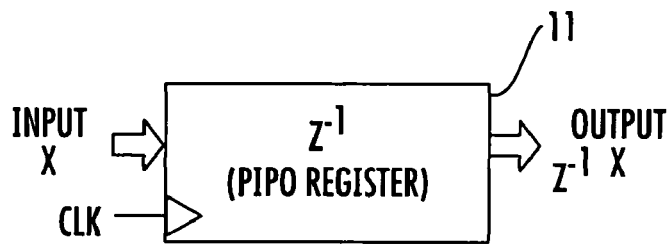
FIG. 1(a) illustrates the existing structure of unit sample delay as in the prior art.
Figure 1B:
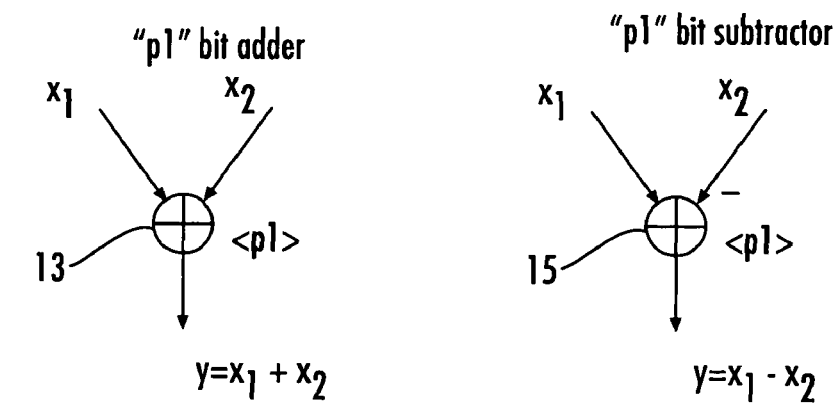
FIG. 1(b) illustrates the existing structures of 'p1' bit adder, 'p1' bit saturator, multiplier and a 'z' bit left shifter as in the prior art.
Figure 1B:
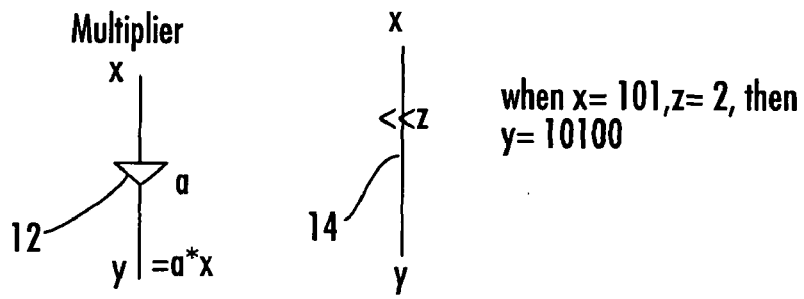
Figure 1C:
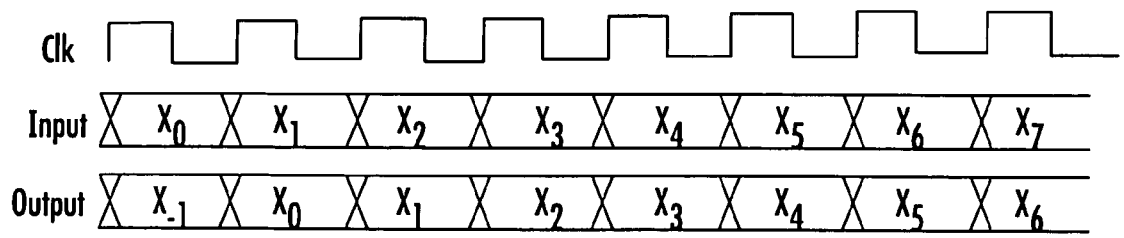
FIG. 1(c) illustrates timing diagram to explain working of unit sample delay as in the prior art.
Figure 2A:
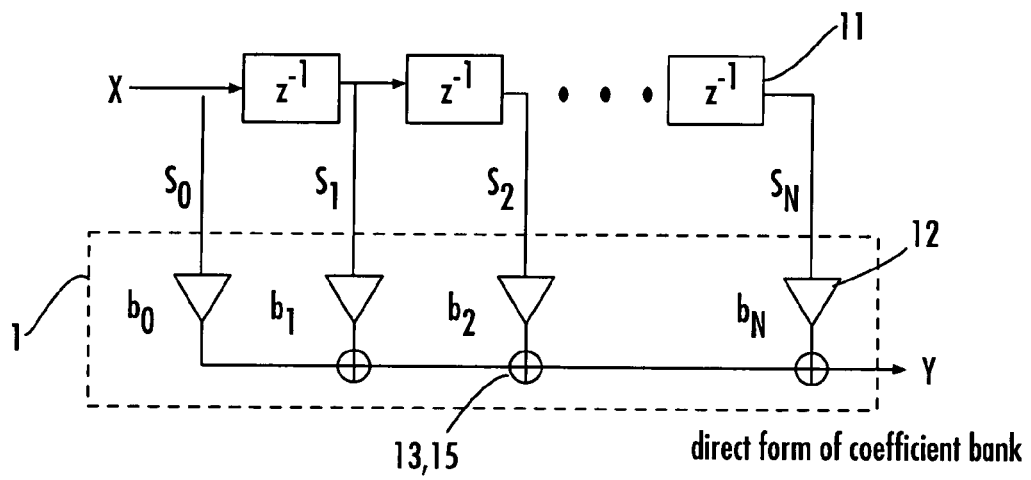
FIG. 2(a) illustrates the existing structure of direct form FIR filter as in the prior art.
Figure 2B:
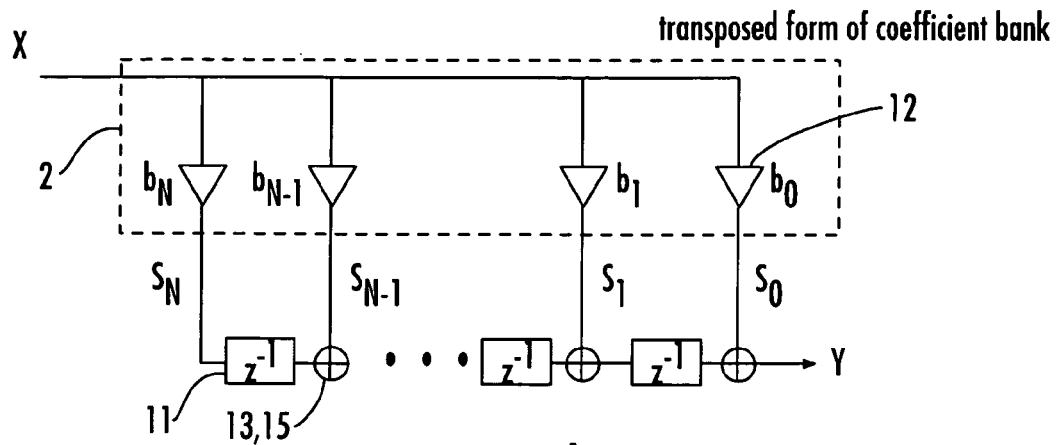
FIG. 2(b) illustrates the existing structure of the transposed form FIR filter as in the prior art.
Figure 2C:
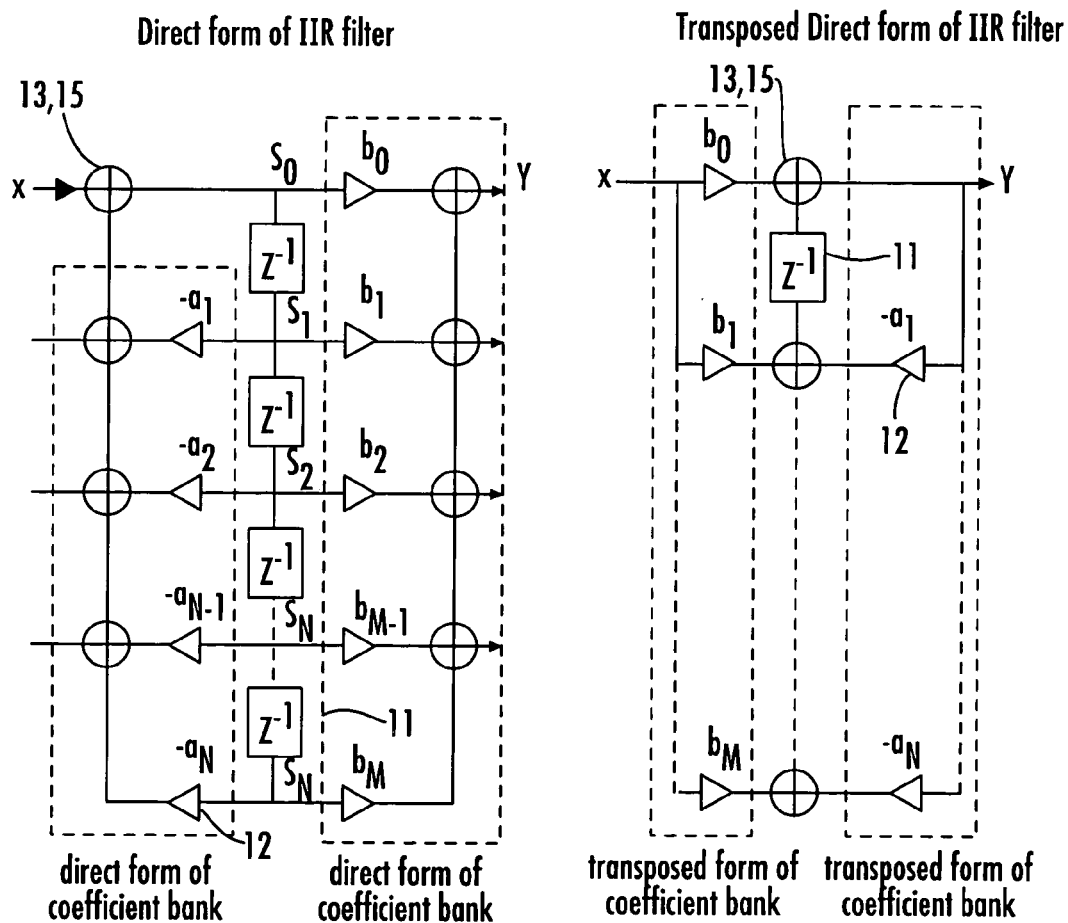
FIG. 2(c) illustrates the existing structure of direct and transposed form IIR filter as in the prior art.
Figure 2D:
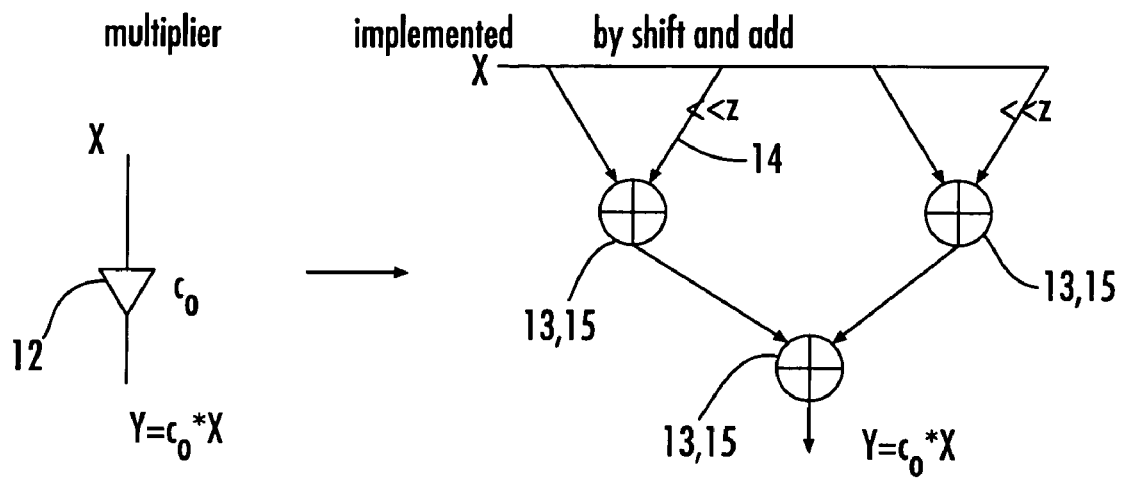
FIG. 2(d) illustrates the generalized implementation of sum of products expression using shifters and adders as in the prior art.
Figure 2E:
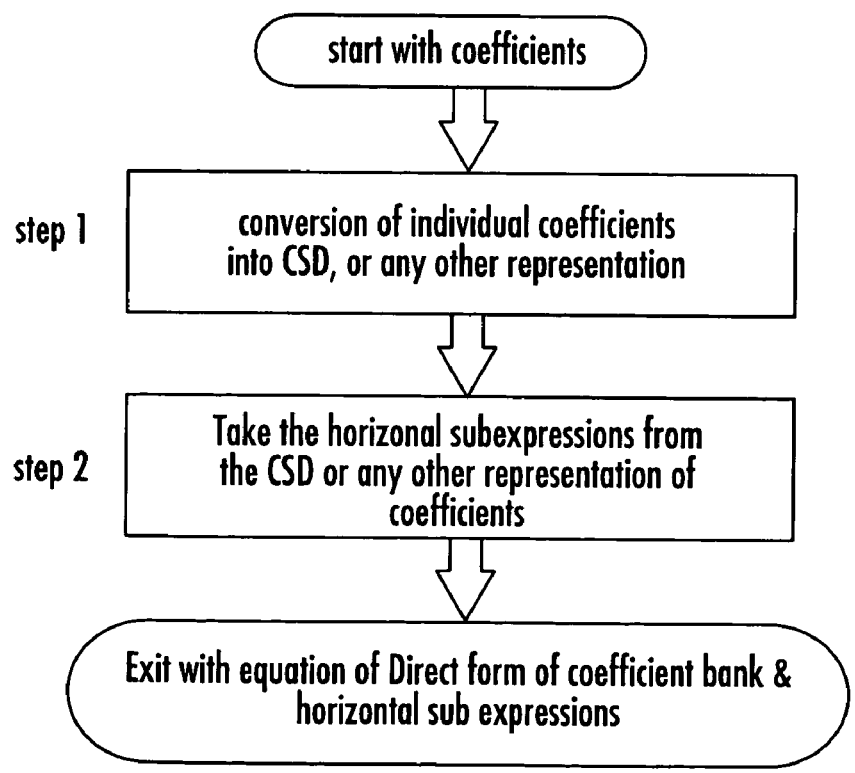
FIG. 2(e) illustrates the existing method for implementation of direct form of coefficient bank as in the prior art.
Figure 2:
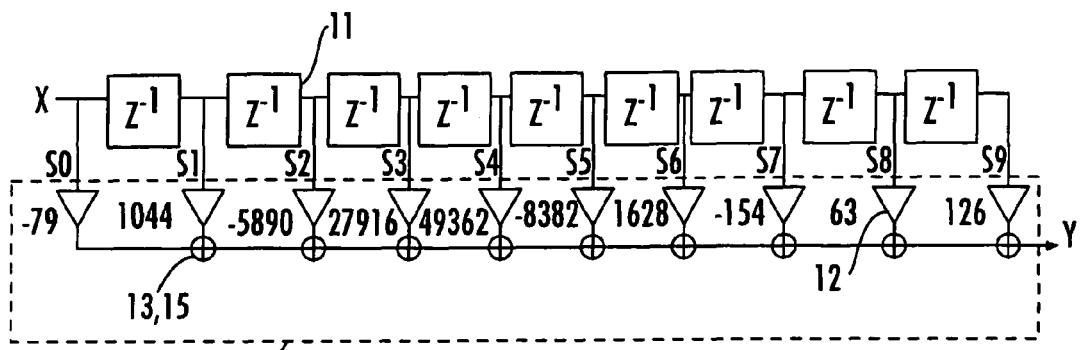
FIG. 2(f1) illustrates the existing direct form structure of FIR filter for a given example as in the prior art.
Figure 2:
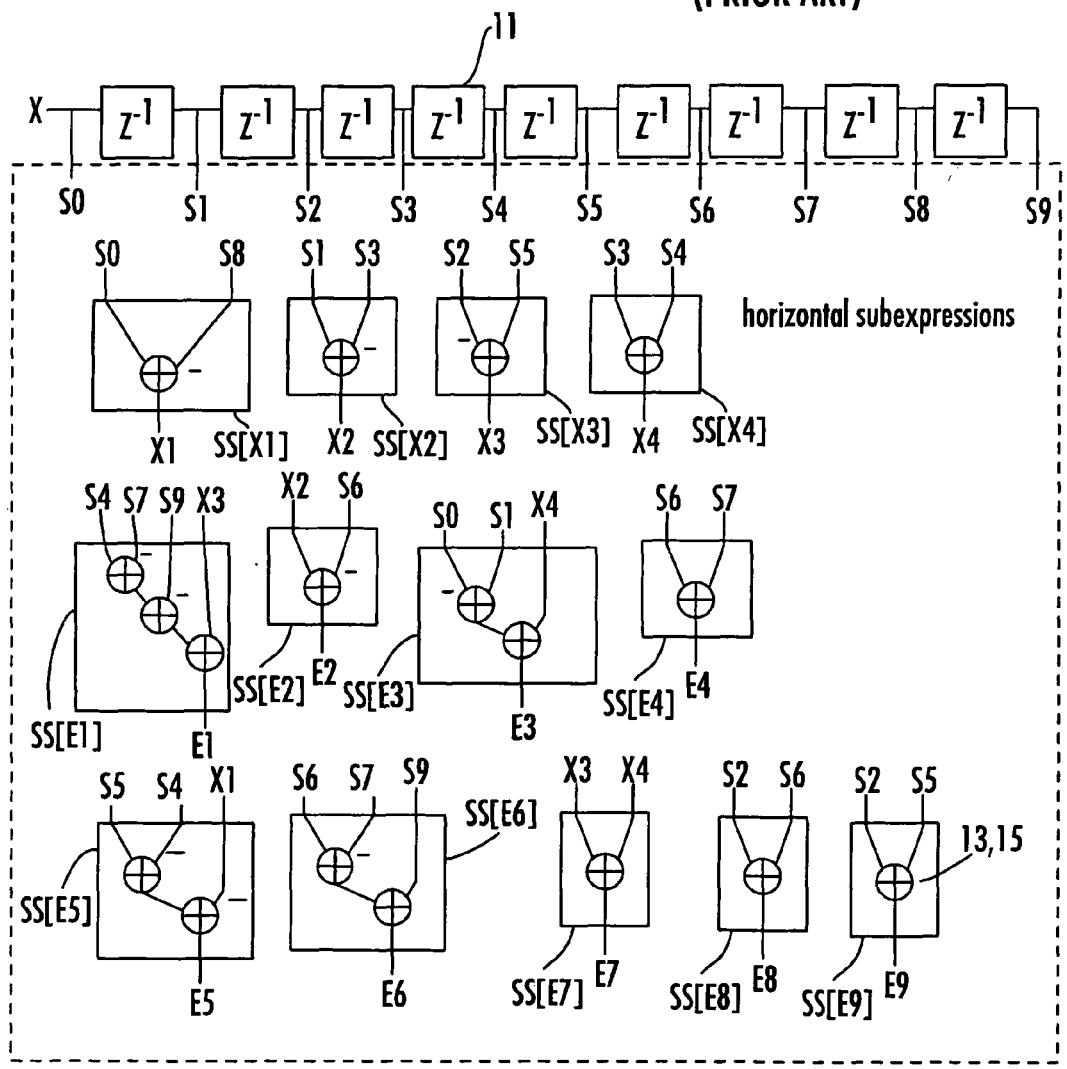
Figure 2:
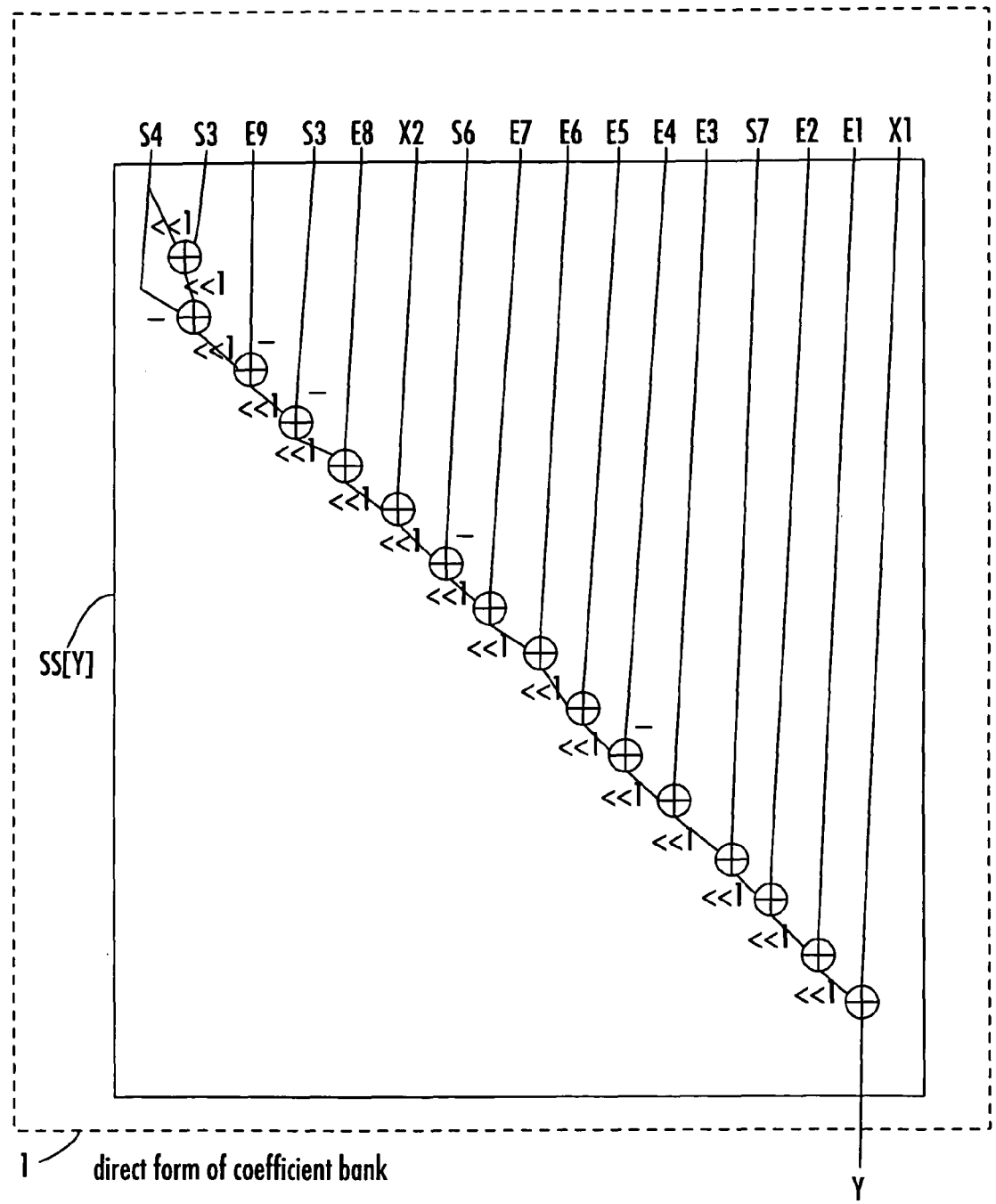
Figure 2G:
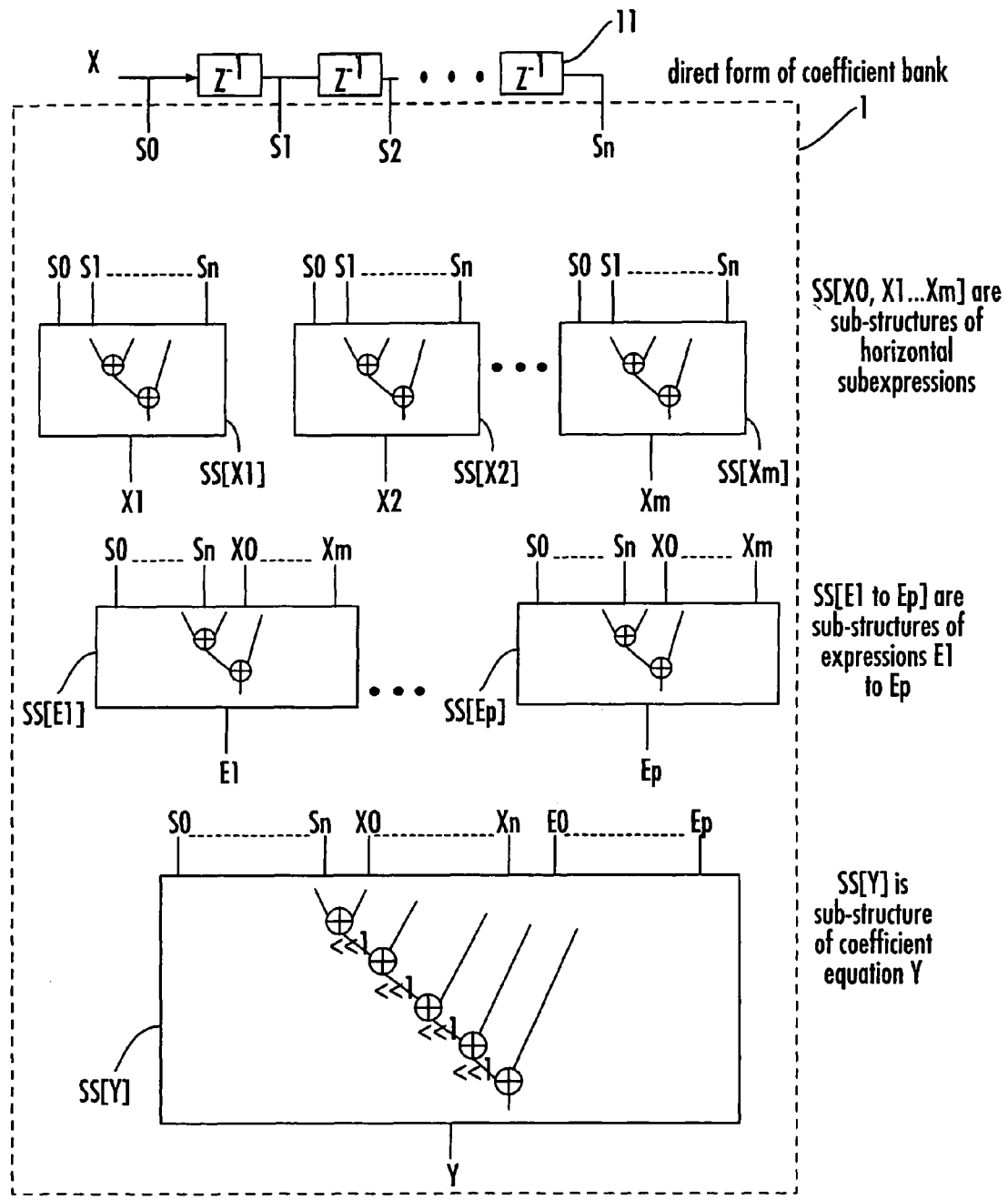
FIG. 2(g) illustrates the existing method for implementation of direct form of coefficient bank as in the prior art.
Figure 2H:
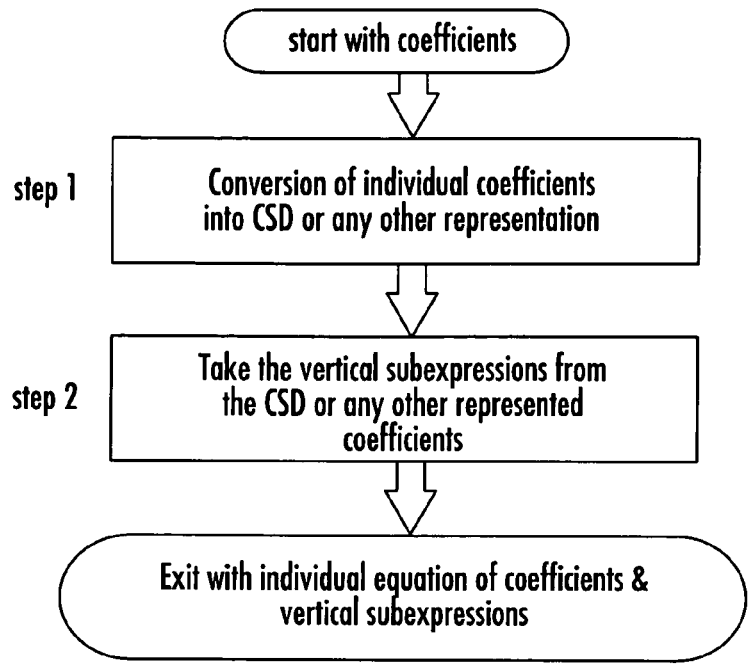
FIG. 2(h) illustrates the existing method for implementation of transposed form of coefficient bank as in the prior art.
Figure 2:
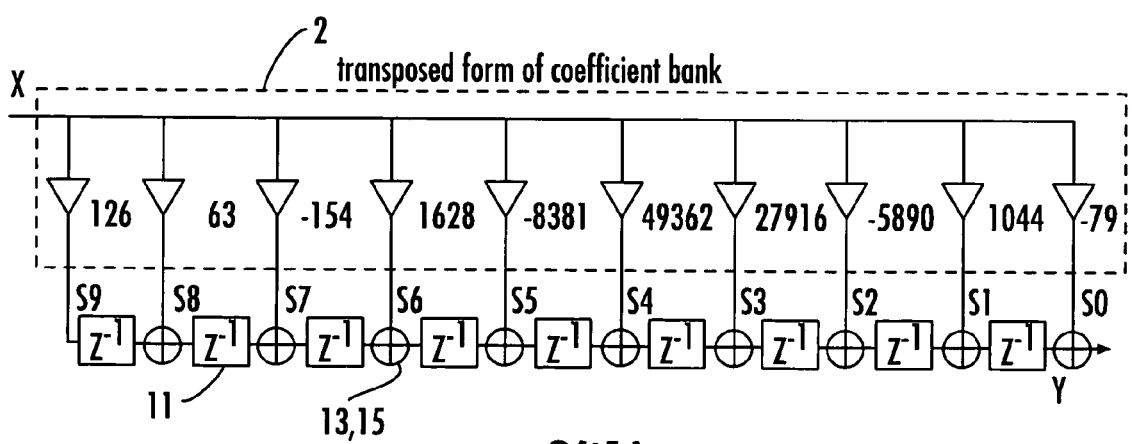
Figure 2:
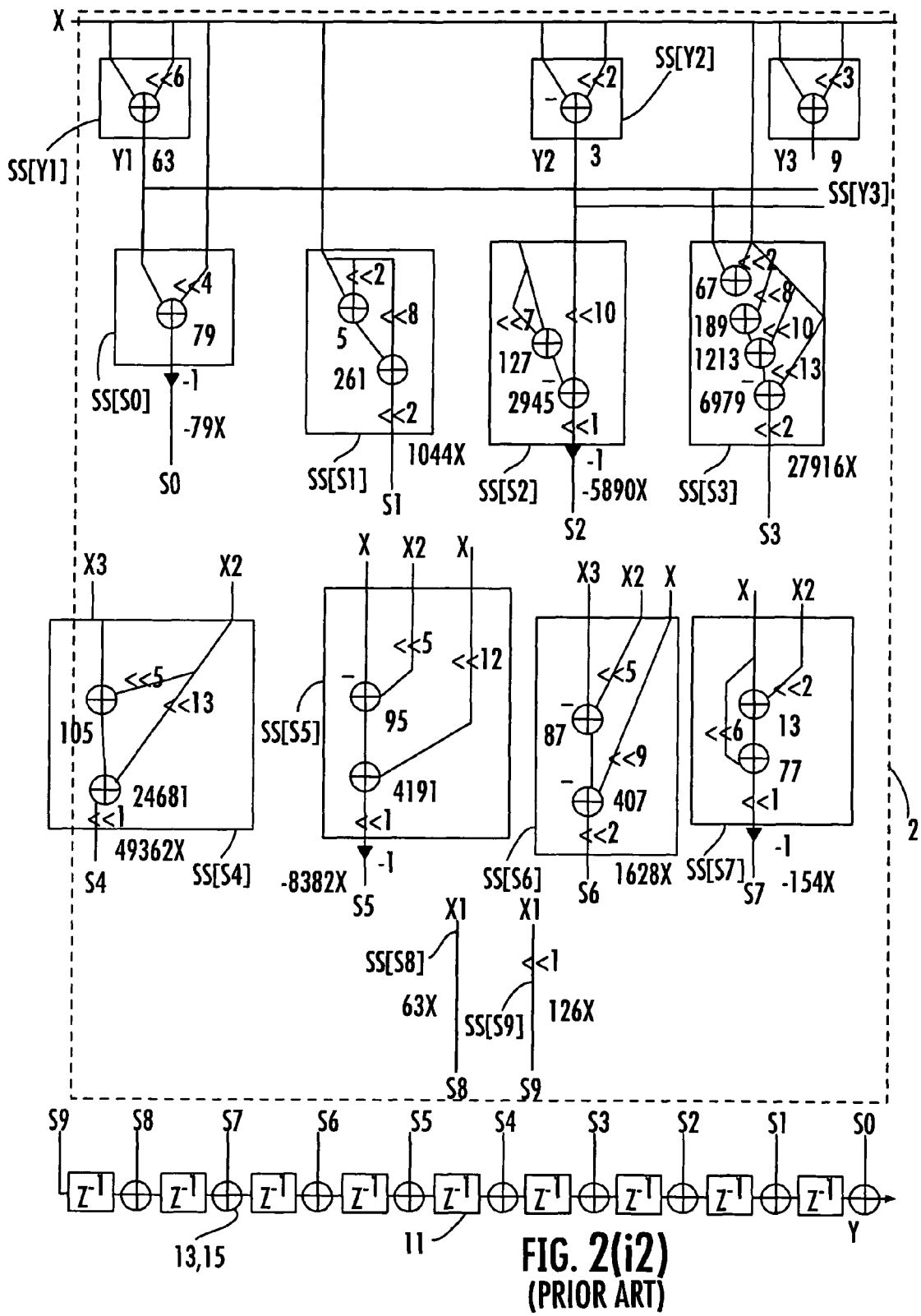
Figure 2J:
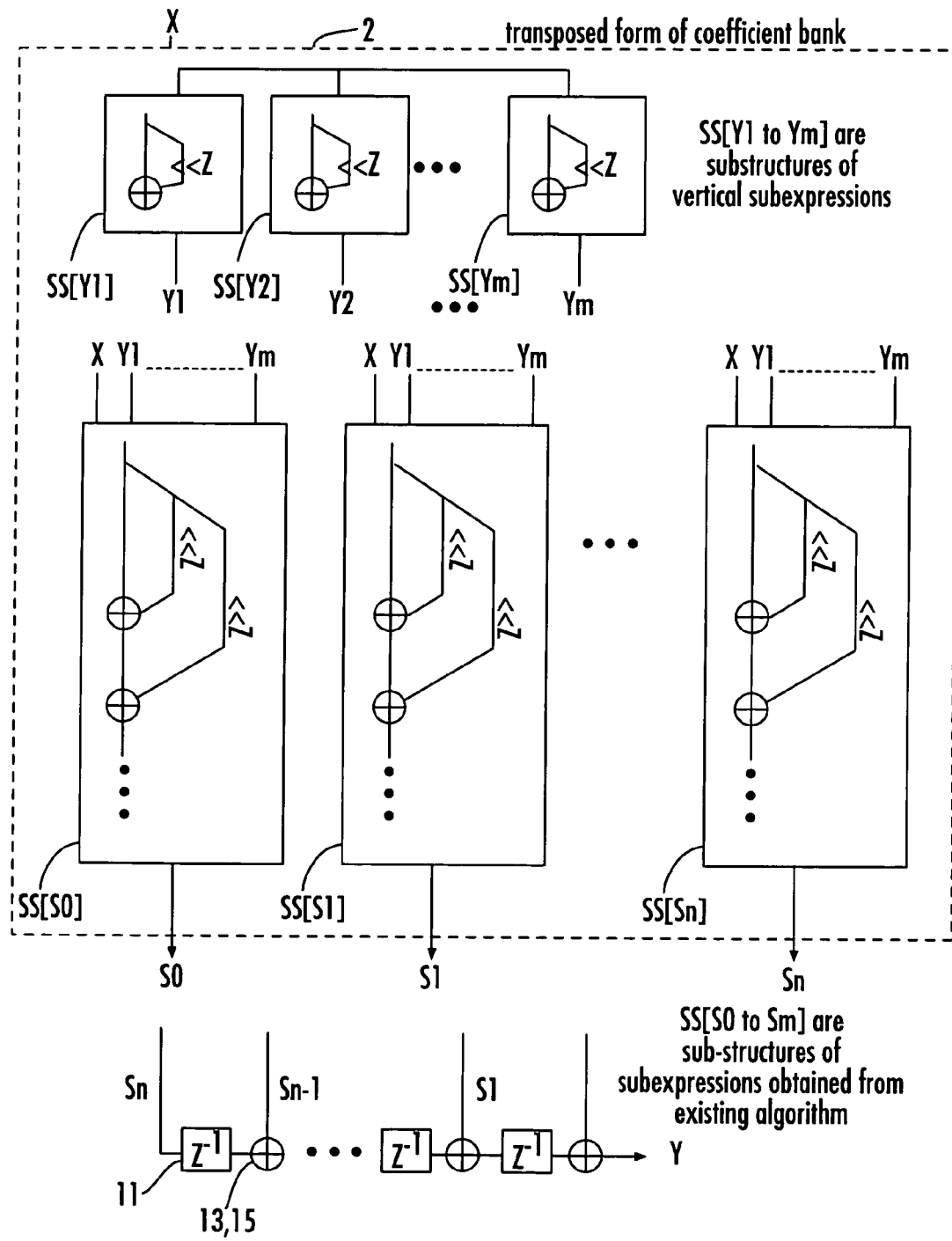
FIG. 2(j) illustrates existing generalized structure of transposed form of coefficient bank as in the prior art.
Figure 2:
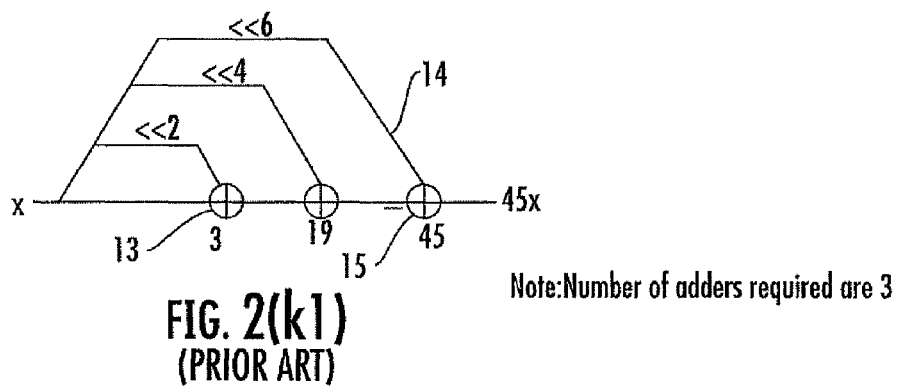
Figure 2:
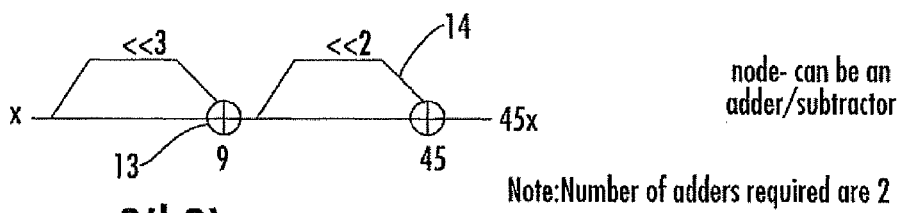
Figure 3:
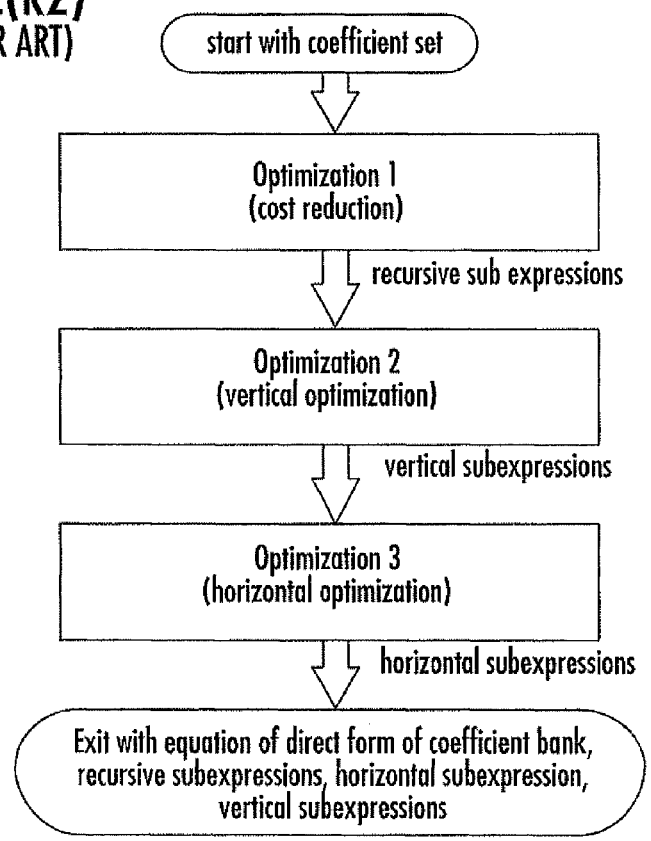
FIG. 3(a1) illustrates the method for implementation of a sum of products expression in accordance with the instant invention.
Figure 3:
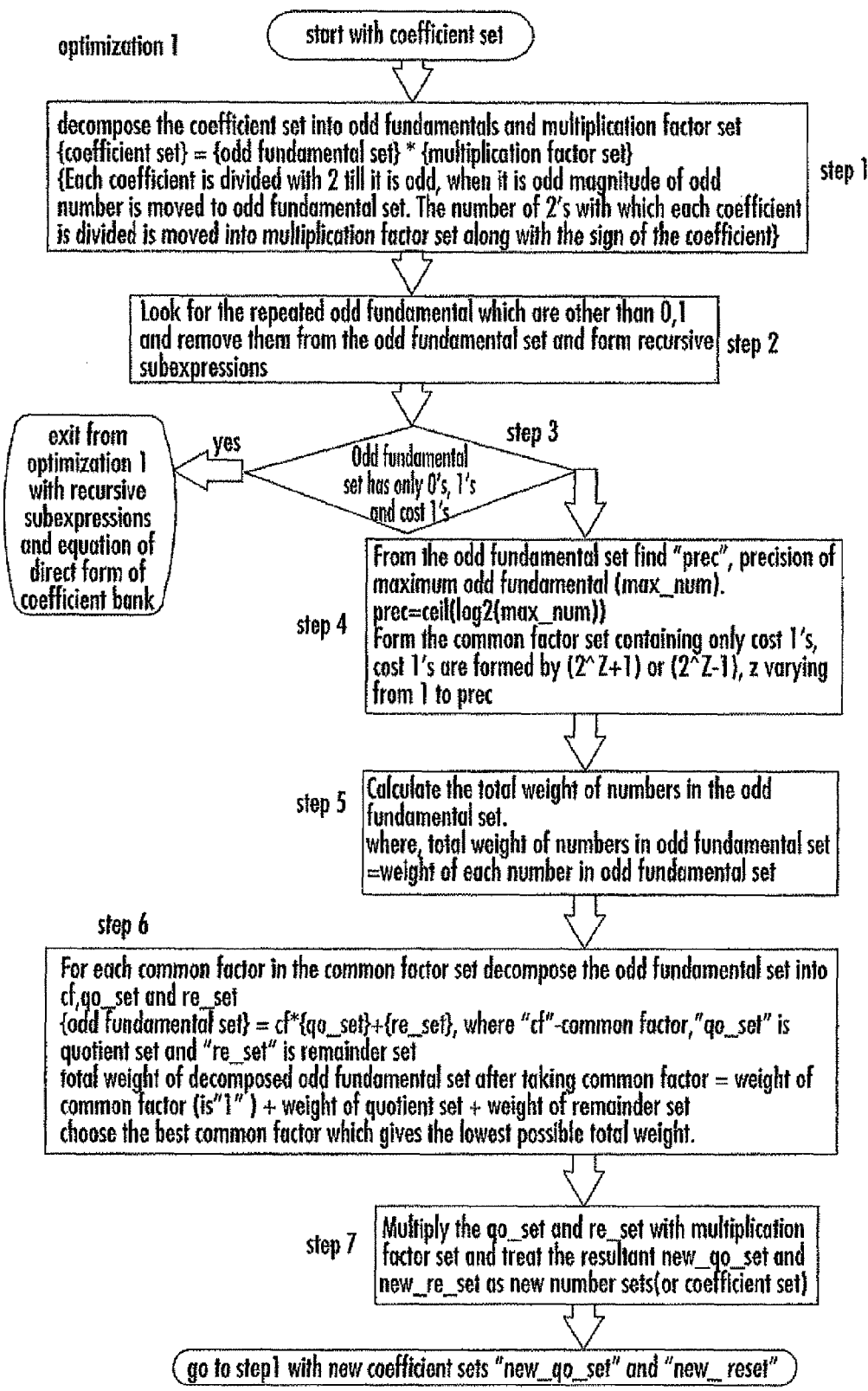
Figure 3:
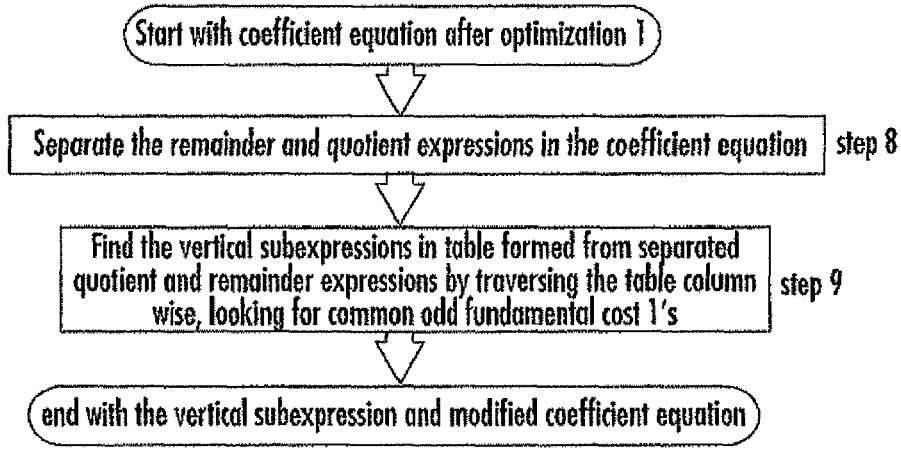
Figure 3:
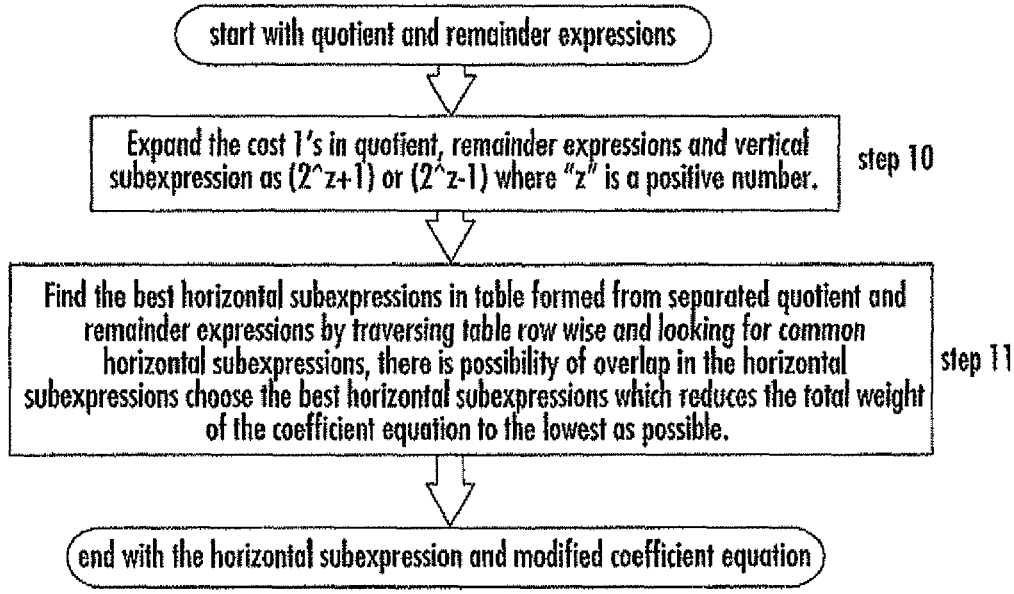
Figure 3:
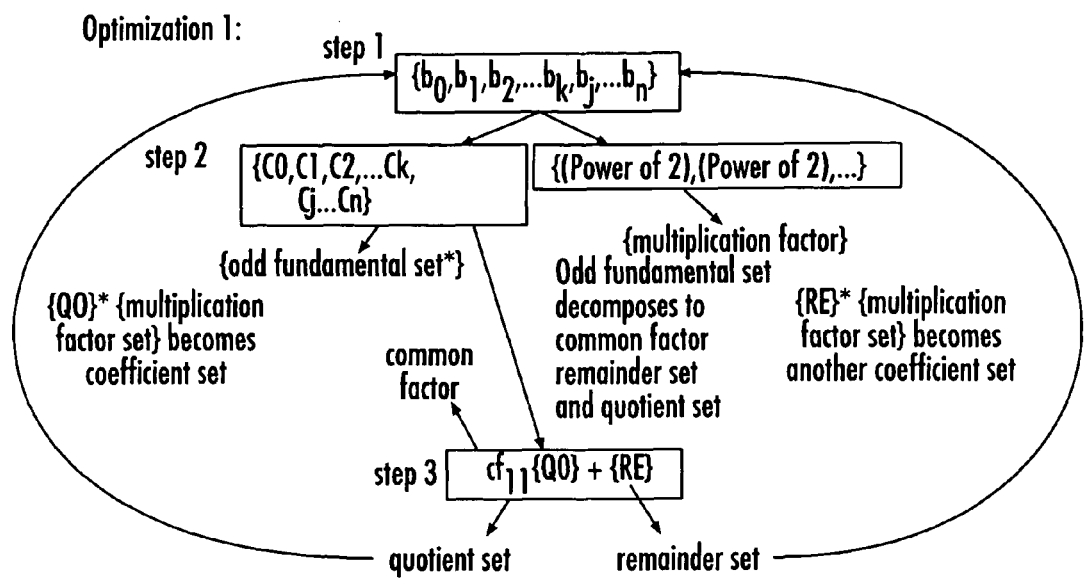
Figure 3:
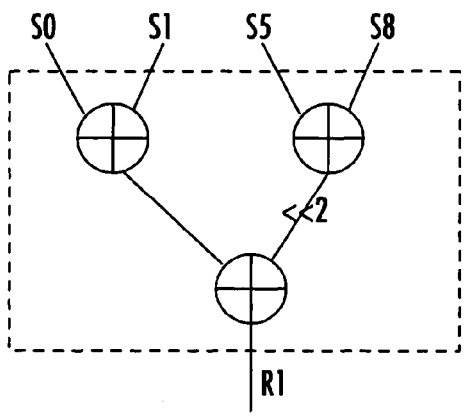
Figure 3:
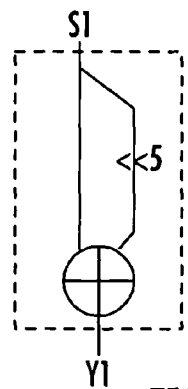
Figure 3:
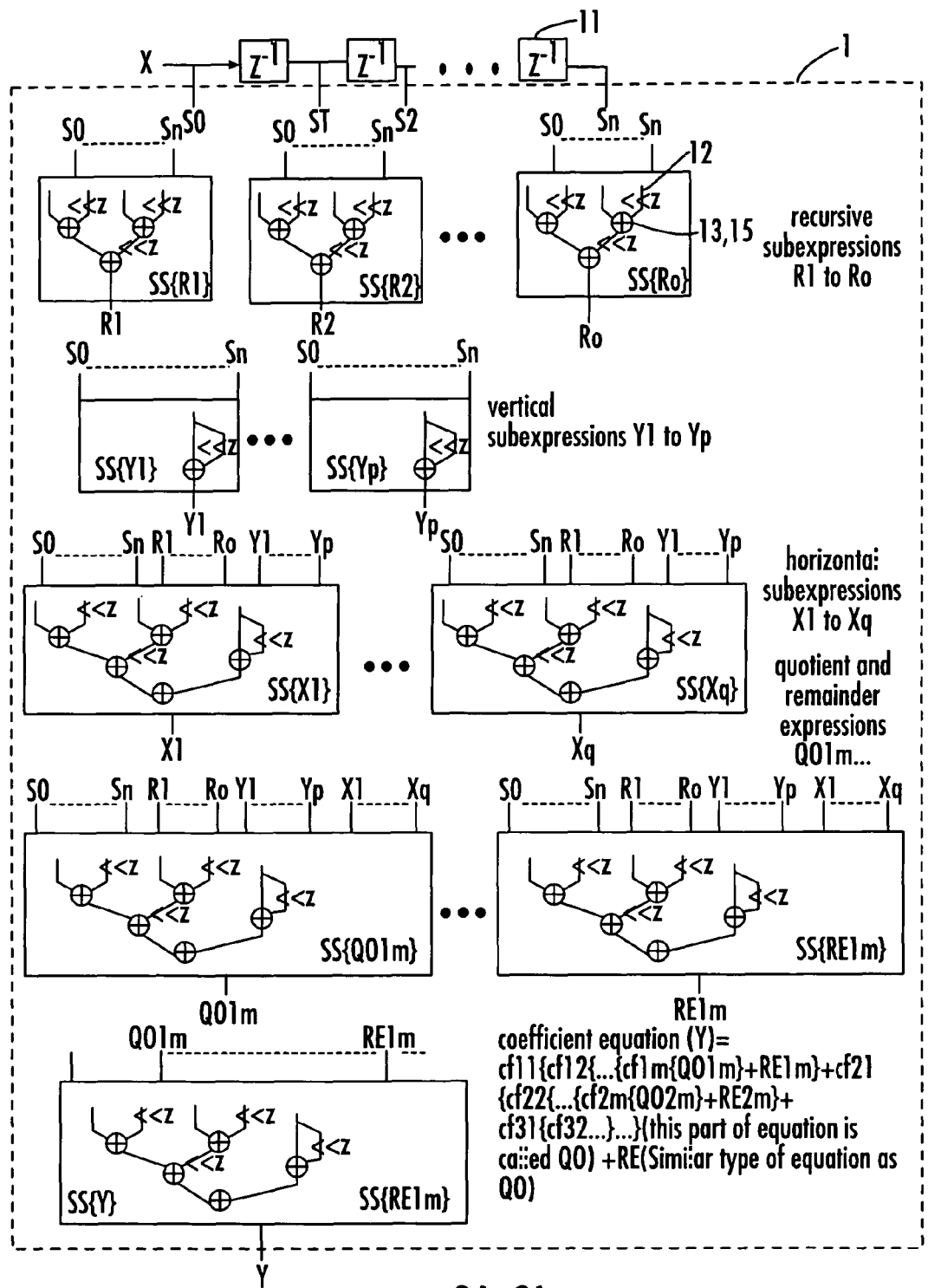
Figure 3:
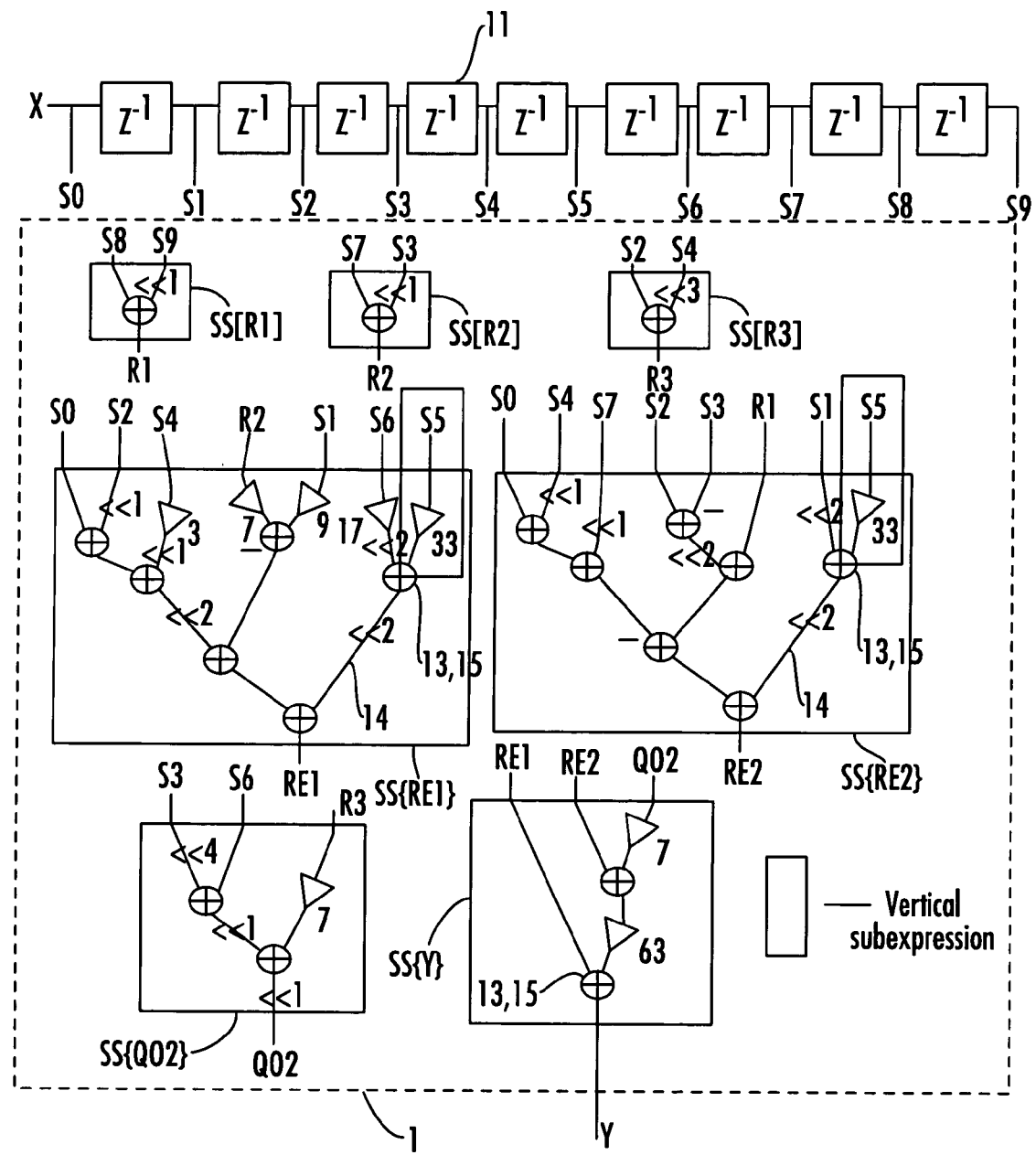
Figure 3:
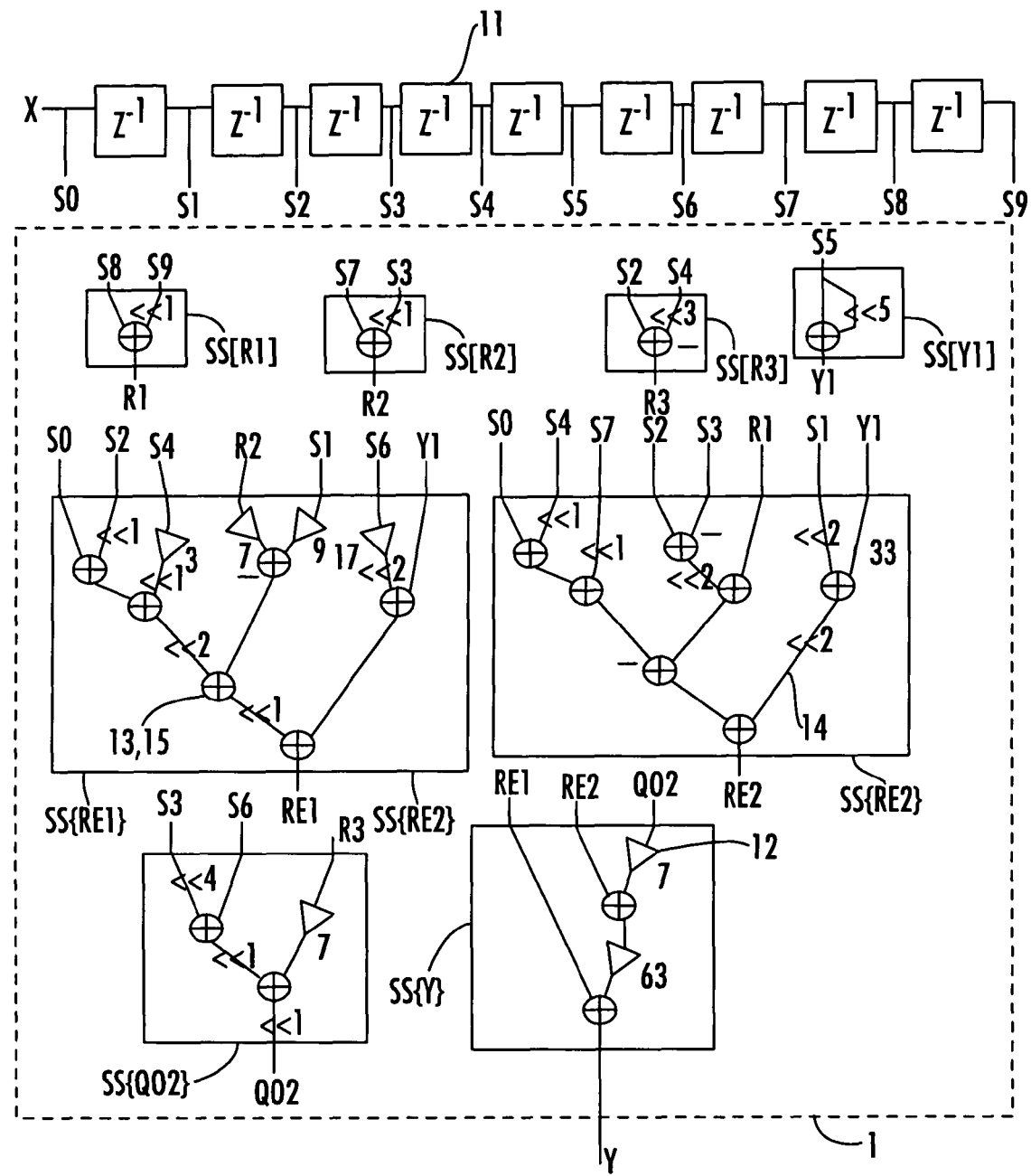
Figure 3:
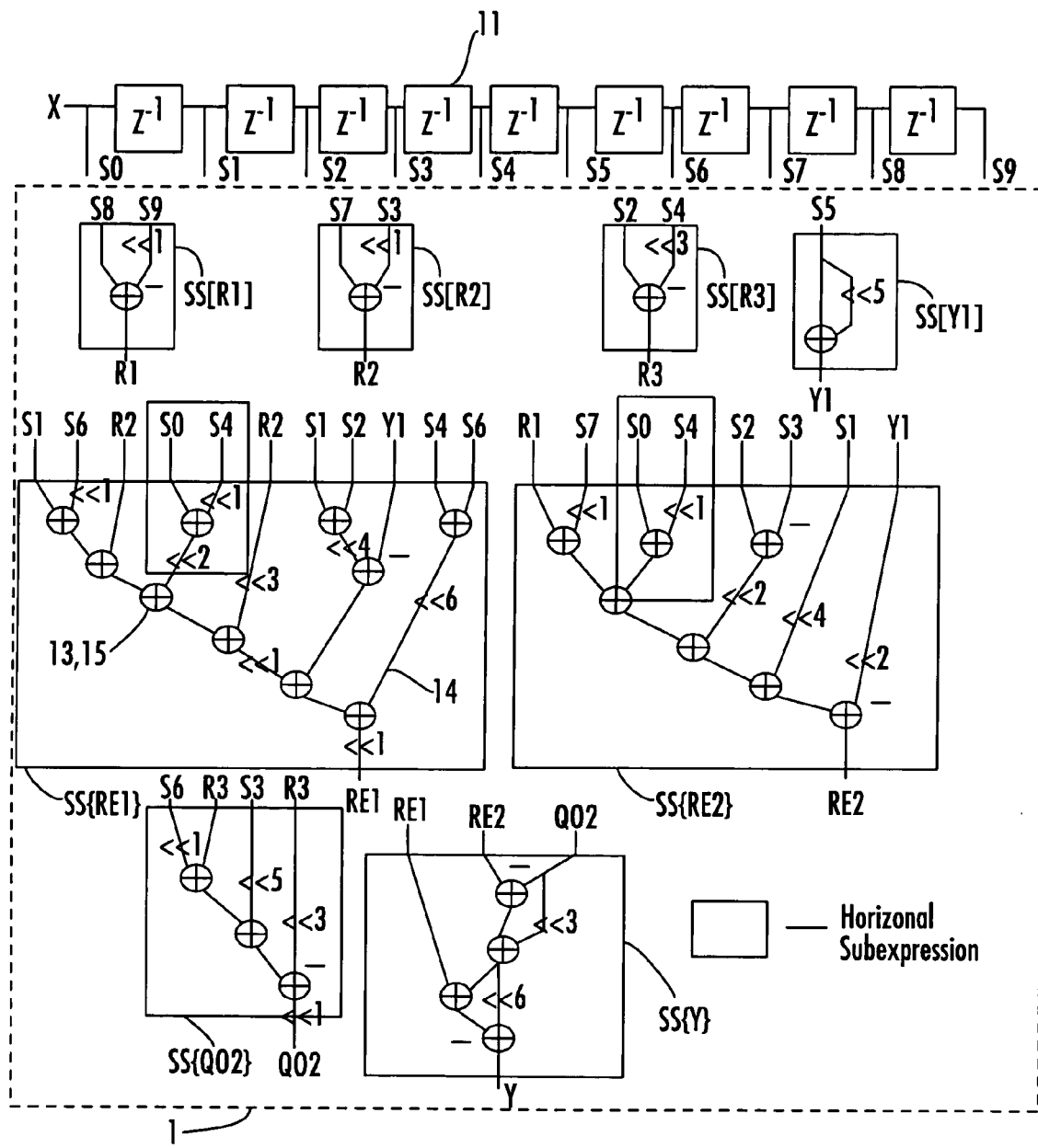
Figure 3:
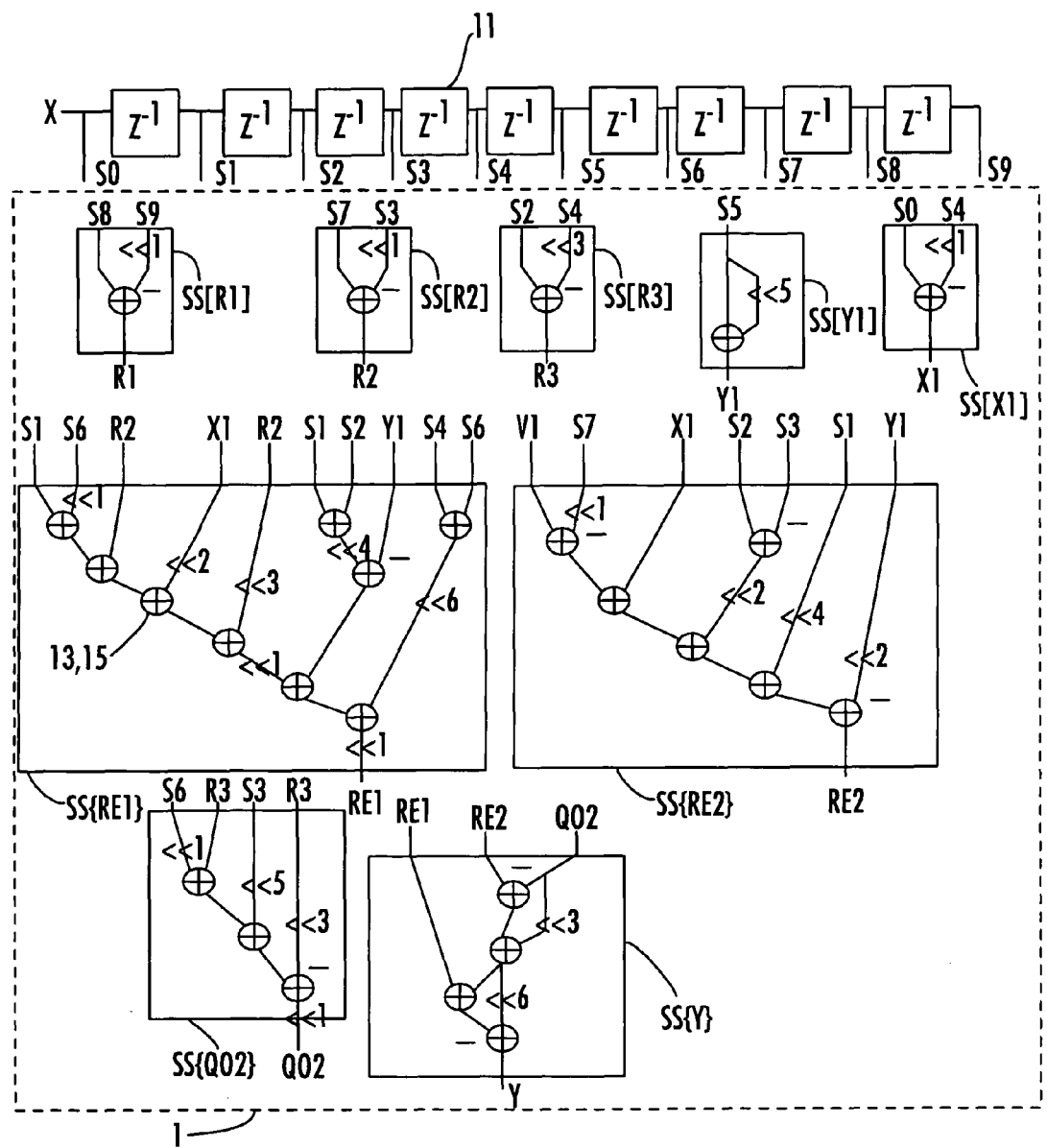
Figure 3:
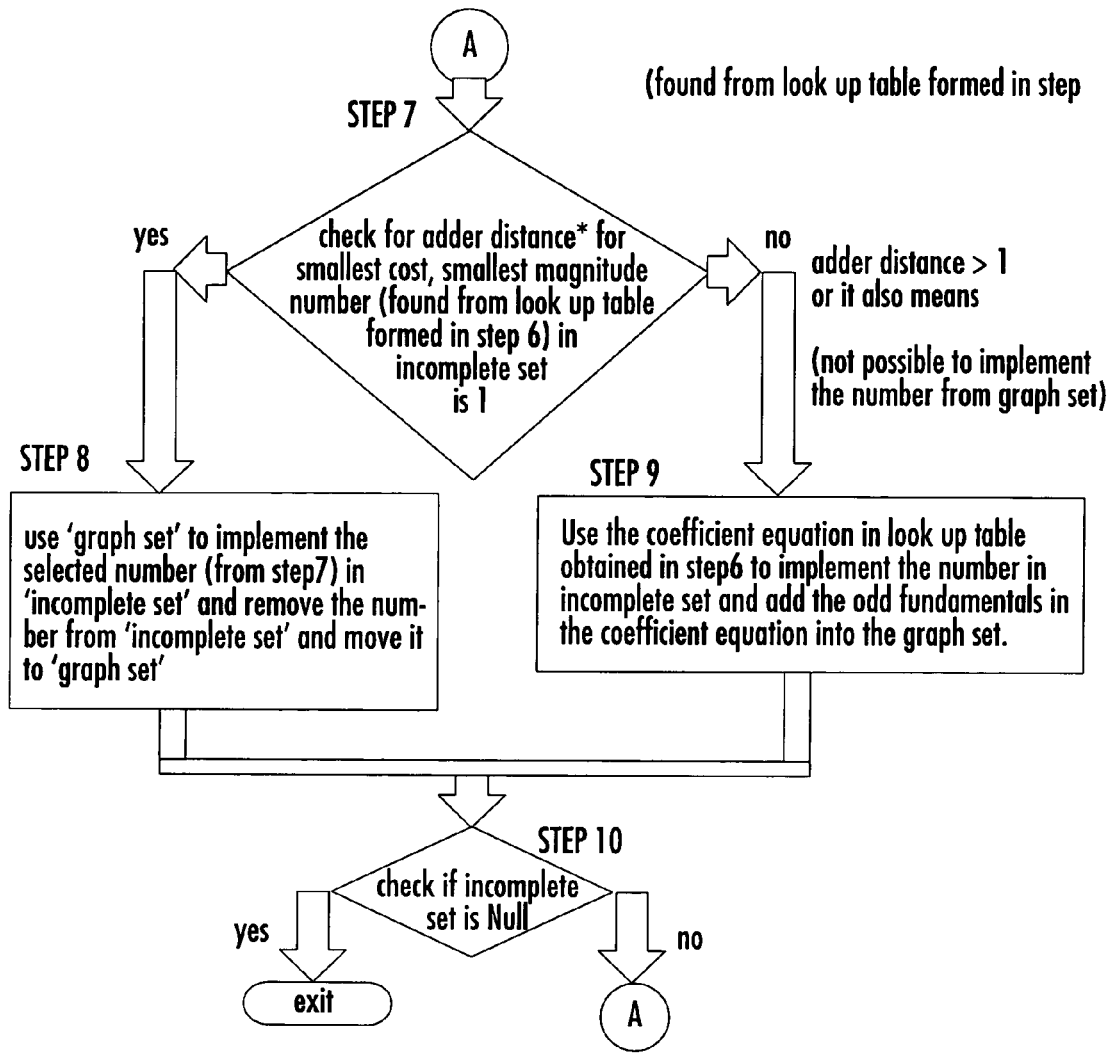
Figure 3:
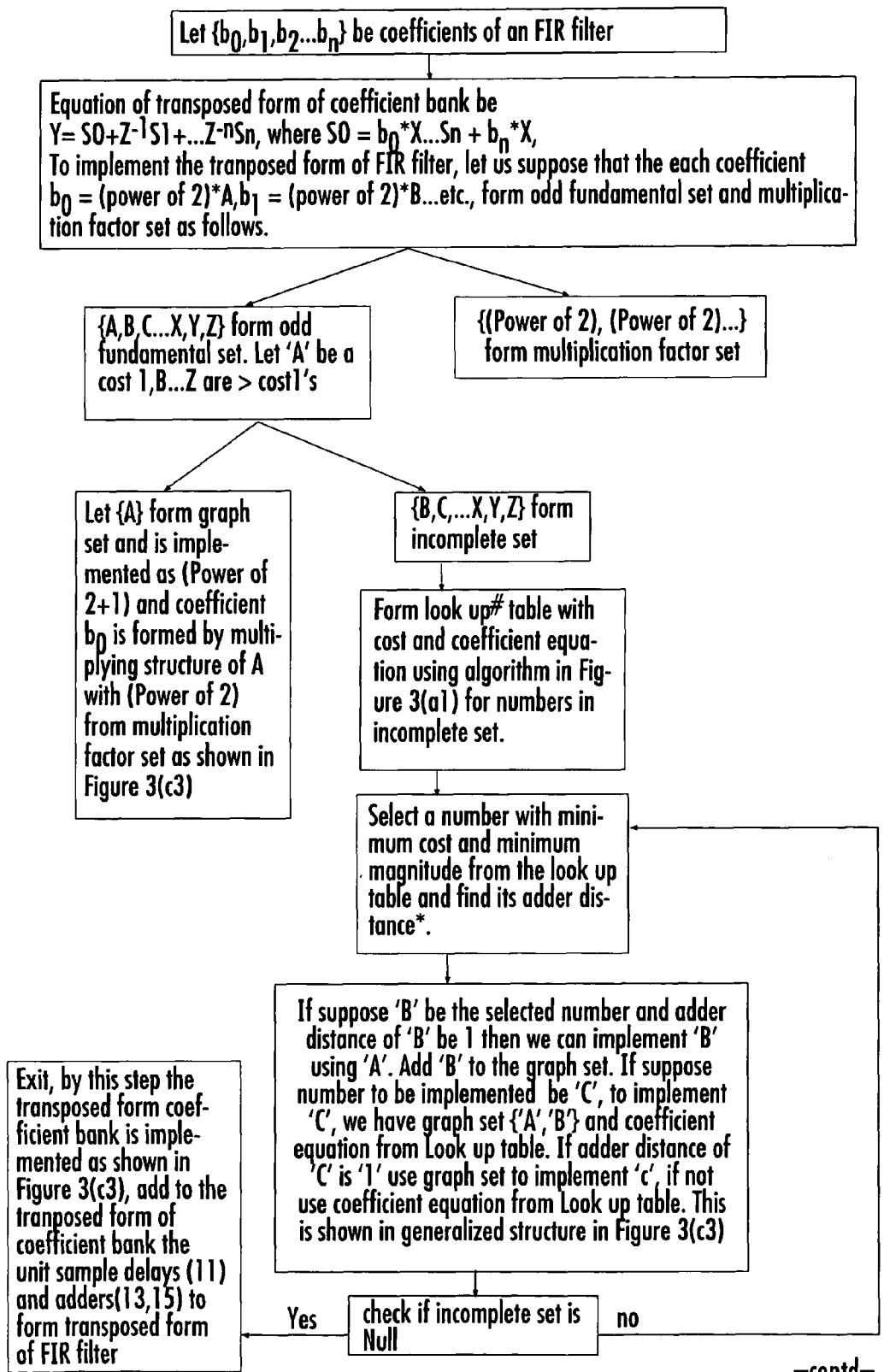
Figure 3:
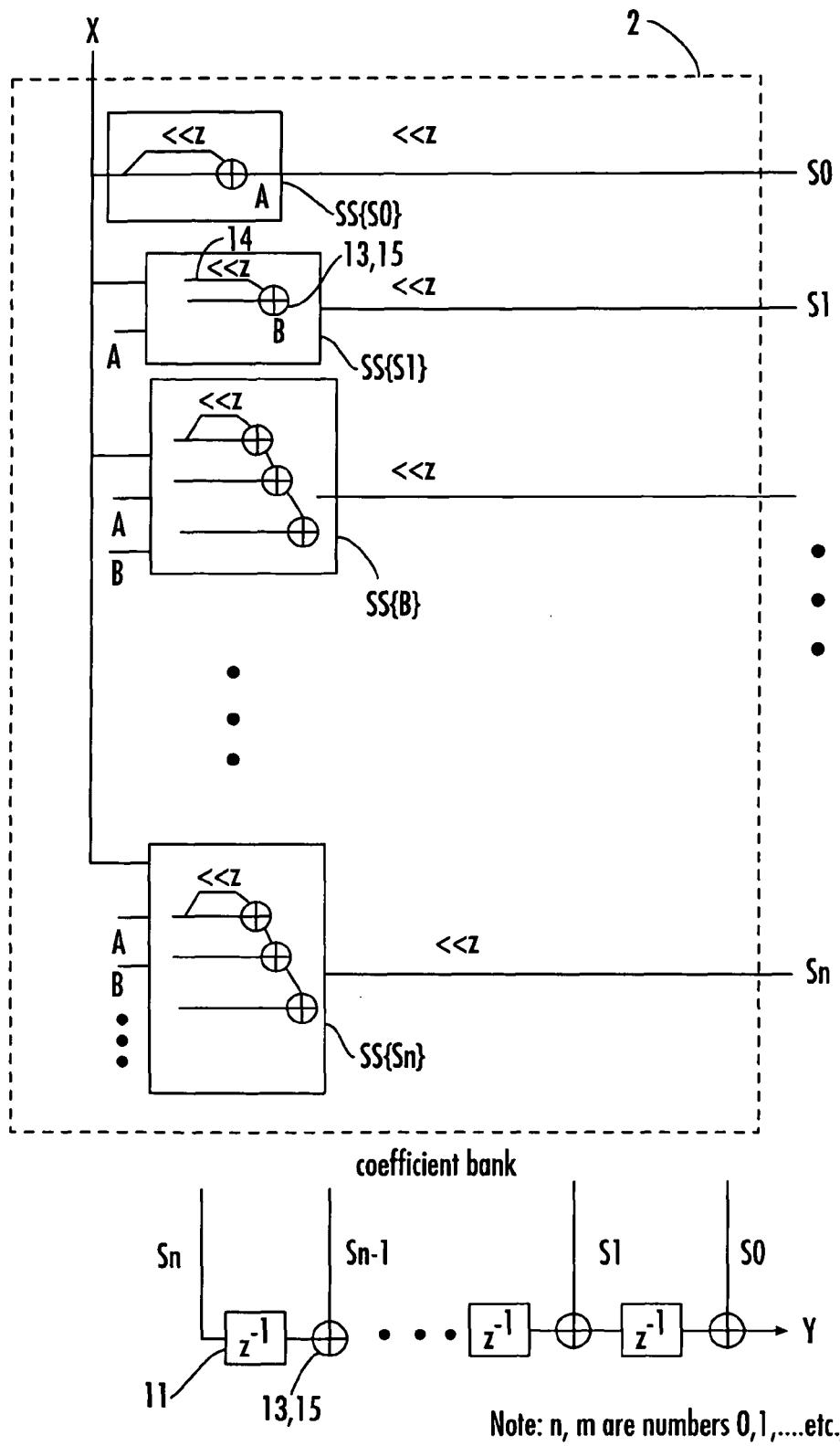
Figure 3D:
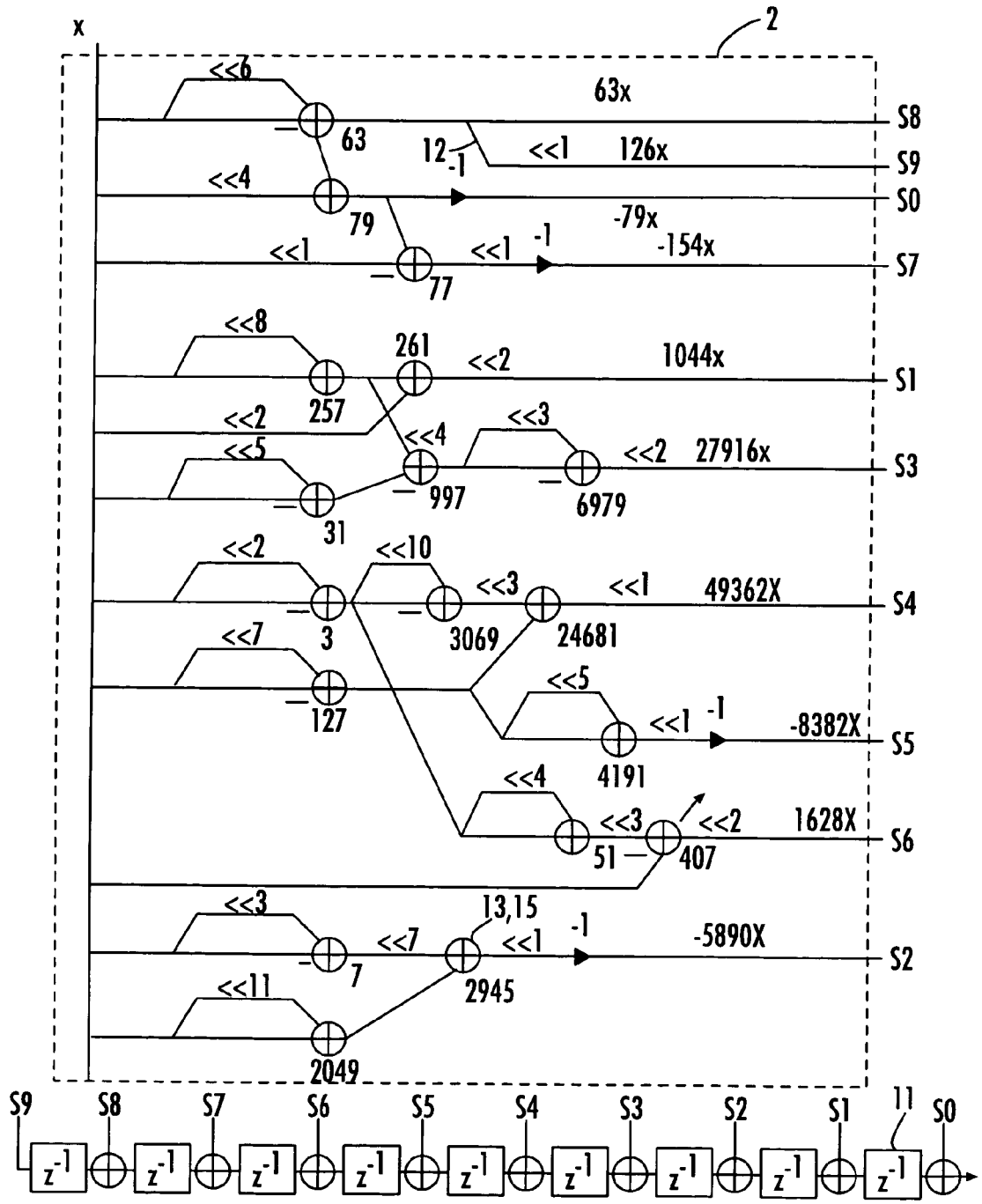
FIG. 3(d) illustrates the structure for implementation of the transposed form of coefficient bank for a given example according to the instant invention.

This optimization is a recursive optimization (FIG. 3 ($a$2)) that generates the modified quotient and remainder sets in the SOP expression after optimizing the adder cost.

Steps 1, 2, 3 of optimization 1 continue till all the numbers in quotient and remainder set are optimized to Cost1s or powers of 2. Cost 1 coefficients are considered as common factors. Optimization is recursively applied so as to generate a minimal area output expression and is hereafter also referred as Recursive Optimization. Given below is the required form of the optimized Sum-of-Products expression.

$$Y=cf_{11}\{cf_{12}\{\ldots\{cf_{1m}\{QO_{1m}\}+RE_{1m}\}+cf_{21}\{cf_{22}\{\ldots\{cf_{2m}\{QO_{2m}\}+RE_{2m}\}+cf_{31}\{cf_{32}\ldots\}\ldots\}+RE \text{ (Similar type of equation as QO)},$$

where $cf_{11}, cf_{12}, \ldots cf_{1m}, cf_{21}, cf_{22}, \ldots cf_{2m}$. are common factors, and $QO_{1m}, QO_{2m} \ldots$ are quotient expressions, and $RE_{1m}, RE_{2m} \ldots$ are remainder expressions, Generalized $QO_{1m}, QO_{2m} \ldots$ and $\ldots, RE_{1m}, RE_{2m}$. are given as follows:

$$QO_{1m}=(\text{Power of 2})*D_{q1m0}*S0+(\text{Power of 2})*D_{q1m1}*S1+\ldots+(\text{Power of 2})*D_{q1mn}*Sn+(\text{Power of 2})*R1+\ldots+(\text{Power of 2})*Ro \ldots$$

$$QO_{2m}=(\text{Power of 2})*D_{q2m0}*S0+(\text{Power of 2})*D_{q2m1}*S1+\ldots+(\text{Power of 2})*D_{q2mn}*Sn+(\text{Power of 2})*R1+\ldots+(\text{Power of 2})*Ro \ldots$$

$$RE_{1m}=(\text{Power of 2})*D_{r1m0}*S0+(\text{Power of 2})*D_{r1m1}*S1+\ldots+(\text{Power of 2})*D_{r1mn}*Sn+(\text{Power of 2})*R1+\ldots+(\text{Power of 2})*Ro \ldots$$

$$RE_{2m}=(\text{Power of 2})*D_{r2m0}*S0+(\text{Power of 2})*D_{r2m1}*S1+\ldots+(\text{Power of 2})*D_{r2mn}*Sn+(\text{Power of 2})*R1+\ldots+(\text{Power of 2})*Ro,$$

where $D_{q1m0}$ to $D_{r2mn}$ etc., are cost 1's, where R1 to Ro are recursive subexpressions of form R1= (Power of 2)*S0+ ... (Power of 2)*Sn .... Ro=(Power of 2)*S0+ ... (Power of 2)*Sn, where (Power of 2) is any power of 2.

Optimization 2

The expressions $QO_{1m}$ to $RE_{2m}$ obtained by applying the method of the optimization 1 are tabulated in the form of Table A as follows in order to factorize vertically. Further, the optimization 2 is hereafter also referred to as Vertical Optimization.

TABLE A

|  | S0 | S1 | ... | Sn | R1 | ... | Ro |
|---|---|---|---|---|---|---|---|
| $QO_{1m}$ | (Power of 2)*$D_{q1m0}$ | (Power of 2)*$D_{q1m1}$ |  | (Power of 2)*$D_{q1mn}$ | (Power of 2) |  | (Power of 2) |
| $QO_{2m}$ | (Power of 2)*$D_{q2m0}$ | (Power of 2)*$D_{q2m1}$ |  | (Power of 2)*$D_{q2mn}$ | (Power of 2) |  | (Power of 2) |
| $RE_{1m}$ | (Power of 2)*$D_{r1m0}$ | (Power of 2)*$D_{r1m1}$ |  | (Power of 2)*$D_{r1mn}$ | (Power of 2) |  | (Power of 2) |
| $RE_{2m}$ | (Power of 2)*$D_{r2m0}$ | (Power of 2)*$D_{r2m1}$ |  | (Power of 2)*$D_{r2mn}$ | (Power of 2) |  | (Power of 2) |

Traversing the table column wise and assuming that $D_{q1m1}=D_{q2m1}$, then the first vertical subexpression is given by $Y1=D_{q1m1}*S1$. Similarly there can be 'p' vertical subexpressions, where 'p' is any positive number.

Generalized equation after optimization 2 is given by:

$$Y=cf_{11}\{cf_{12}\{\ldots\{cf_{1m}\{QO_{1m}\}+RE_{1m}\}+cf_{21}\{cf_{22}\{\ldots\{cf_{2m}\{QO_{2m}\}+RE_{2m}\}+cf_{31}\{cf_{32}\ldots\}\ldots\}+RE;$$

where $cf_{11}, cf_{12}, \ldots cf_{1m}, cf_{21}, cf_{22}, \ldots cf_{2m} \ldots$ etc., are common factors, and $QO_{1m}, QO_{2m} \ldots$ are quotient expressions, and $RE_{1m}, RE_{2m} \ldots$ are remainder expressions, where $QO_{1m}$=(Power of 2)*$D_{q1m0}$*S0+ ... +(Power of 2)*$D_{q1mn}$*Sn+(Power of 2)*R1+ ... +(Power of 2)*Ro+ (Power of 2)*Y1 ... +(Power of 2)Yp.

$RE_{1m}$=(Power of 2)*$D_{r1m0}$*S0+ ... +(Power of 2)*$D_{r1mn}$*Sn+(Power of 2)*R1+ ... +(Power of 2)*Ro+ (Power of 2)*Y1 .... +(Power of 2)*Yp;

where R1 to Ro are recursive subexpressions and Y1 to Yp are vertical subexpressions, $Y1=D_{qmm1}*S1$, $Yn=D_{qnmn}*S_n$.

Optimization 3

The input coefficient sets are subjected to a horizontal factorization here and the optimization is hereafter also referred to as a horizontal optimization. Expanding Cost 1s in $QO_{nm}$ to $RE_{nm}$ (nth quotient and remainder expressions), and in the vertical subexpressions Y1 to Yp to $(2^z+1)$ or $(2^z-1)$, where 'z' is any positive number.

Assuming that cost 1's in the expressions $QO_{1m}$ to $RE_{1m}$ have been expanded to $D_{q1m0}=(2^{\wedge}A0)+(2^{\wedge}B0)$, $D_{q1mn}=(2^{\wedge}An)+(2^{\wedge}Bn)$, $D_{rm10}=(2^{\wedge}A0)+(2^{\wedge}B1)$, $D_{r1mn}=(2^{\wedge}An)+(2^{\wedge}Bk)$. Substituting the expanded cost 1's in $QO_{nm}$ and $RE_{nm}$ results in the following subexpression. $QO_{1m}=(2^{\wedge}A0)*S0+(2^{\wedge}B0)*S0 \ldots (2^{\wedge}An)*Sn+(2^{\wedge}Bn)*Sn+(\text{Power of }2)*R1+\ldots+(\text{Power of }2)*Ro+(\text{Power of }2)*Y1\ldots+(\text{Power of }2)*Yp \ldots RE_{1m}=(2^{\wedge}A0)*S0+(2^{\wedge}B1)*S0 \ldots (2^{\wedge}An)*Sn+(2^{\wedge}Bk)*Sn+(\text{Power of }2)*R1+\ldots+(\text{Power of }2)*Ro+(\text{Power of }2)*Y1\ldots+(\text{Power of }2)Yp$; where $(2^{\wedge}A0)$, $(2^{\wedge}B0)$, $(2^{\wedge}An)$, $(2^{\wedge}Bn)$, $(2^{\wedge}B1)$, $(2^{\wedge}Bk)$ are powers of 2. The expressions $QO_{1m}$ to $RE_{1m}$ are represented in Table B as follows.

TABLE B

| | S0 | ... Sn | R1 ... | Ro | Y1 ... | Yp |
|---|---|---|---|---|---|---|
| $QO_{1m}\ldots$ | $(2^{\wedge}A0)+$ $2^{\wedge}B0$ | $(2^{\wedge}An)+$ $(2^{\wedge}Bn)$ | (Power of 2) | (Power of 2) | (Power of 2) | (Power of 2) |
| $RE_{1m}\ldots$ | $(2^{\wedge}A0)+$ $(2^{\wedge}B1)$ | $(2^{\wedge}An)+$ $(2^{\wedge}Bk)$ | (Power of 2) | (Power of 2) | (Power of 2) | (Power of 2) |

Assuming that the expression $((2^{\wedge}A0)*S0+(2^{\wedge}An)*Sn))$ row 1 of Table B is equal to the expression $((2^{\wedge}A0)*S0+(2^{\wedge}An)*Sn))$ in row 2. Thus $X1=((2^{\wedge}A0)*S0+(2^{\wedge}An)*Sn)$ is the derived horizontal subexpression. Thus, the resultant horizontal subexpressions can be derived as follows:

$Y=cf_{11}\{cf_{12}\{\ldots\{cf_{1m}\{QO_{1m}\}+RE_{1m}\}+cf_{21}\{cf_{22}\{\ldots\{cf_{2m}\{QO_{2m}\}+RE_{2m}\}+cf_{31}\{cf_{32}\ldots\}\ldots\}+RE$
(Similar type of equation as QO), where $QO_{1m}=(\text{Power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp+(\text{Power of }2)*X1+\ldots+(\text{Power of }2)*Xq,$ $RE_{1m}=(\text{Power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp+(\text{Power of }2)*X1+\ldots+(\text{Power of }2)*Xq,$ $QO_{2m}=(\text{Power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp+(\text{Power of }2)*X1+\ldots+(\text{Power of }2)*Xq,$ $RE_{2m}=(\text{Power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp+(\text{Power of }2)*X1+\ldots+(\text{Power of }2)*Xq,$ where horizontal subexpressions $X1=(\text{power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp,$ $Xq=(\text{power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp,$ where R1 to Ro are recursive subexpressions, Y1 to Yp are vertical subexpressions and X1 to Xq are horizontal subexpressions. Thus, the coefficient equation 'Y' is implemented with expansion of common factors as $(2^z+1)$ or $(2^z-1)$ where z is a positive number.

The method is hereby described with reference to the structural implementation of the optimized sum-of-products expression, the embodiment herein described pertaining to the direct and transposed form of digital filter realization.

Mapping of the generalized subexpressions and final expression into a generalized hardware structure: The generalized recursive subexpressions can be written as;

$R_1=(\text{Power of }2)*S_0+\ldots(\text{Power of }2)*S_n,$ $R_o=(\text{Power of }2)*S_0+\ldots(\text{Power of }2)*Sn,$ where, Power of 2 is an integral power of 2.

Mapping generalized recursive subexpression into hardware can be illustrated with the help of an example as follows.

Assuming that the recursive subexpression is represented by the equation; $R1=S0+S1+4*S5+4*S8$ and the optimized subexpression be $R1=S0+S1+4*(S5+S8)$.

The area efficient way, of implementing the subexpression R1 is, implementing S0+S1 and adding $4*(S5+S8)$ to it. (The area efficiency here is in having incremental growth of precision at different levels. Any conventional algorithm resulting in incremental growth of precision of adders at different levels can be used to implement the subexpressions. Further, since the method mainly deals with reducing the number of adders not the precision of the adder's, the method to reduce the precision of adders is not discussed herein). This resultant structure in FIG. 3(a2)-1 is called a convergent set of 2SAD (2-input Shifter and Adder).

The input set to the convergent structure in FIG. 3(a2)-1 is {S1, S1, S5, S8}. As illustrated in FIG. 3(a2)-1, the complete input set S0 to Sn is not fed to the 2SAD block, as subexpression R1 does not have all the inputs. Further the shifter structure in FIG. 3(a2)-1 would depend on the powers of 2 applied to the coefficients in the subexpression R1. The convergent set of 2SAD structure can be extended to any subexpression with (power of 2) coefficients for S0 to Sn. The subexpressions R1 to Ro map on to the converging substructure SS [$R_1$] to SS [$R_o$] in hardware as shown in FIG. 3(a3).

In the Vertical subexpression $Y1=D_{qmm1}*S1$, $Yp=D_{qpmn}*S_n$. $D_{qmm1}$, $D_{qpmn}$ are the numbers that can be expanded as $2^z+1$ or $2^z-1$, where z is a positive number. Mapping the generalized vertical subexpression into hardware can be illustrated with the help of an example as follows.

Assuming that the vertical subexpression is represented by the equation $Y1=33*S1=32*S1+S1$. This can be implemented as 1SAD (1 input shift and add) as shown in FIG. (3a2-2). Since the Vertical Subexpressions in would result in the substructures as shown in FIG. (3a2-2), it is therefore observed that the Y1 to Yp would form substructures; SS[Y1]...SS[Yp] as illustrated in FIG. 3(a3). The left shifts in 1SAD would depend on the powers of two assigned to the coefficients $D_{qmm1}, \ldots D_{qpmn}$.

The horizontal subexpressions for the instant predefined coefficient set inputs are given as below:

$X1=(\text{power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp,\ldots$ $Xq=(\text{power of }2)*S0+\ldots(\text{Power of }2)*Sn+(\text{Power of }2)*R1+\ldots(\text{Power of }2)*Ro+(\text{Power of }2)*Y1+\ldots+(\text{Power of }2)*Yp$ The above subexpressions result in the similar convergent 2SAD substructure. The substructures SS[X1] to SS[Xq] are illustrated in FIG. 3($a$3). The quotient and remainder subexpressions $QO_{1m} \ldots RE_{2m}$ given below:

$QO_{1m}$=(Power of 2)*$S0$+ . . . (Power of 2)*$Sn$+(Power of 2)*$R1$+ . . . (Power of 2)*$Ro$+(Power of 2)*$Y1$+ . . . +(Power of 2)*$Yp$+(Power of 2)*$X1$+ . . . +(Power of 2)*$Xq$, $RE_{1m}$=(Power of 2)*$S0$+ . . . (Power of 2)*$Sn$+(Power of 2)*$R1$+ . . . (Power of 2)*$Ro$+(Power of 2)*$Y1$+ . . . +(Power of 2)*$Yp$+(Power of 2)*$X1$+ . . . +(Power of 2)*$Xq$, The resultant structure for the above stated subexpressions is analogous to the convergent 2SAD substructures. The substructure is further illustrated as SS [QO1m] . . . SS[RE1m] . . . in FIG. 3($a$3). The final equation of the coefficient bank combining all the quotient, and remainder expressions can be written as Y=$cf_{11}$ {$cf_{12}$ { . . . {$cf_{1m}$ {$QO_{1m}$}+$RE_{1m}$}+$cf_{21}$ {$cf_{22}$ { . . . {$cf_{2m}$ {$QO_{2m}$}+$RE_{2m}$}+$cf_{31}$ {$cf_{32}$ . . . }+RE (Similar type of equation as QO), Expanding the common factor's $cf_{11}$ . . . as $2^z+1$ or $2^z-1$ would result in another expression with coefficients as power of 2's which will result in convergent set of 2SAD structure with input set {$QO_{1m}$, $RE_{1m}$ . . . }. This structure is shown as SS[Y] in FIG. 3($a$3).

Generalized Structure depicting the minimal area integrated circuit implementation of the sum of products expression.

The generalized structure is shown in FIG. 3($a$3) to map the results of the algorithm. The generalized structure contains taps S0 to Sn from the plurality of unit sample delays (11) connected to a group of substructures SS[R1] to SS[Ro] with inputs S0 to Sn each generating plurality of signals R1 to Ro. The substructures SS[Y1] to SS[Yp] with inputs S0 to Sn, generate the plurality of signals Y1 to Yp, where p is any positive number; substructures SS[X1] to SS[Xq] with inputs S0 to Sn, R1 to Ro and Y1 to Yp each generating signals X1 to Xq, where q is any positive number, substructures SS[QO1m] . . . SS[RE1m] . . . with inputs S0 to Sn, R1 to Ro, Y1 to Yp and X1 to Xq generating signals QO1m . . . RE1m etc., and substructure SS[Y] formed from inputs QO1m . . . to RE1m . . . generating output Y, these substructures contain a plurality of adders (13, 15) and shifter 14, these substructures are connected together to form the coefficient bank of the direct form of FIR filter or IIR filter.

The invented method for the direct form implementation of the coefficient bank can be used to implement a single number also. This is done by applying a single number at the input of the algorithm in FIG. 3($a$1). A single number given to the algorithm would result in an optimized shift and add hardware structure of the number.

The method of the instant invention is hereby described with reference to the given (Optimization 1) coefficient set as the input.

Direct Form of Coefficient Bank Implementation:

Decompose high cost terms into some multiples of cost1's and power of 2's. The algorithm has three optimizations. The three optimizations are explained with the help of an example as follows:

Optimization 1: This is a recursive optimization. By this optimization an individual coefficient 'coeff 1' will be decomposed to:

coeff 1=$cf(qo)$+$re$ or coeff 1=$cf(qo)$-$re$;

where cf=common factor, qo=quotient, re=remainder.

Further, the coefficient set called 'coeffset' will be decomposed to coeffset=cf(QO)+RE. Note: The negative coefficients are not treated separately, negative coefficient are implemented as positive coefficients with a subtractor at the end of substructure while adding to other substructures. The SOP realization for the example coefficient set is described with reference to the steps involved in the method as illustrated in FIG. 3($a$1).

Steps Involved in Optimization 1:

Step 1: Decompose the coefficient set into odd fundamentals and multiplication factor set:

{coefficient set}={odd fundamental set}*{multiplication factor set}, (Each coefficient is divided with 2 till it is odd. If it is of odd magnitude, then it is moved to the odd fundamental set. The number of 2's with which each coefficient is divided is moved into multiplication factor set along with the sign of the coefficient.)

For the given set of coefficients; the coefficient set is decomposed to an odd fundamental set and multiplication factor set as follows:

{−79,1044,−5890,27916,49362,−8382,1628,−154,63,126}={79,261,2945,6979,24681,4191,407,77,63,63}*{−1,4,−2,4,2,−2,4,−2,1,2};

where the Coefficient set={−79,1044,−5890,27916,49362,−8382,1628,−154, 63,126},
Odd fundamental set={79,261,2945,6979, 24681, 4191, 77,63,63}, individual elements in the odd fundamental set are called odd fundamentals. Multiplication factor set={−1,4,−2, 4,2,−2,4,−2,1,2}

Step 2: Searching for repeated odd fundamentals other than 0 &1 and removing them from the odd fundamental set and form recursive subexpressions. In the example, the odd fundamental set "63" is the repeated odd fundamental, and the example odd fundamental set changes as:

{79,261,2945,6979,24681,4191,407,77,0,0,63}* {−1, 4,−2,4,2,−2,4,−2,0,0,1}.

Two 0's have come in place of S8, S9 and one 63 has come in position of S10. The recursive subexpression thus generated is $R_1$=S8+2S9.

Step 3: Checking the odd fundamental set has only 0's, 1's and cost1's and exiting from the optimization 1 with recursive sub-expressions and equation of direct form of coefficient bank, else proceed to step 4 for optimizing the numbers greater than the cost 1 numbers.

Step 4: From the odd fundamental set compute the "prec", precision of maximum odd fundamental (max_num).

prec=ceil(log 2(max_num))

Form the common factor set, which contains only cost1's, cost1's are formed by $(2^z+1)$ or $(2^z-1)$, where z varies from '1' to ' prec'.

For the example 'max_num'=24681, 'prec'=ceil (log 2(abs(24681)))=15 and the common factor set is (3, 5, 7, 9 . . . 32769} formed by $2^z+1$ or $2^z-1$, z varying from '1' to '15'.

Step 5: Calculate the total weight of the numbers in the odd fundamental set wherein, the Total weight of numbers in the odd fundamental set=weight of each number in the odd fundamental set. The weight of each odd fundamental in the example odd fundamental set is in Table 3 as given below:

TABLE 3

| Number | Weight |
|---|---|
| 79 | 100 |
| 261 | 100 |
| 2945 | 100 |
| 6979 | 100 |
| 24681 | 100 |
| 4191 | 100 |
| 407 | 100 |
| 77 | 100 |
| 63 | 2 |

The total weight of the numbers in the odd fundamental set for the example=802, along similar lines the weight of any number set can be calculated.

Step 6: For each common factor in the common factor set decompose the odd fundamental set into a common factor, quotient and remainder.

$$\{Odd\ fundamental\ set\} = cf^*\{QO\} + \{RE\};$$

where 'cf'-common factor, 'QO' is quotient set and 'RE' is remainder set, total weight of decomposed odd fundamental set after setting common factor equal to the weight of common factor+weight of quotient set+weight of remainder set.

For each common factor of the example starting from 3 to 32769 calculate the total weight. Choose the best common factor, which gives the lowest possible total weight. The best common factor for given example is "63" as it reduces the total weight of the odd fundamental set from "802" to "323", thus the lowest possible weight is achieved.

The odd coefficient set is decomposed into common factor, quotient set and remainder set as follows:

$$\{79,261,2945,6979,24681,4191,407,77,0,0,63\} = 63\{1, 4,47,111,391,66,7,1,0,0,1\} + \{16,9,-16,-14,48, 33,-34,14,0,0,0\}$$

where the common factor=63,
quotient set=$\{1,4,47,111,391,66,7,1,0,0,1\}$
remainder set=$\{16,9,-16,-14,48,33,-34,14,0,0,0\}$ Step 7: Multiply the QO and RE with multiplication factor set and treat the resultant new_QO and new_RE as new coefficient sets. Go to step 1 with new coefficient sets 'new_QO' & 'new_RE'. For the given example 'new_QO'=$\{1,4,47,111, 391,66,7,1,0,0,1\}*\{-1,4,-2,4,2,-2,4,-2,0,0,1\} = \{-1,16, -94,444,782,-132,28,-2,0,0,1\}$—this number set passes through all the steps in optimization 1 again and stops with '7' as common factor. Another number set 'new_RE'=$\{16,9, -16,-14,48,33,-34,14,0,0,0\}*\{-1,4,-2,4,2,-2,4,-2,0,0, 1\} = \{-16,36,32,-56,96,-66,-136,-28,0,0,0\}$—this contains all cost1's and pow_2's and stops at step 3 while passing through the steps of optimization 1.

After the optimization 1 the coefficient equation of the example number set for direct form implementation of coefficient bank is in equation (3a).

$$Y=[-16]^*S0+36^*S1+32^*S2+96^*S4+[-66]^*S5+ \\ [-136]^*S6+[-28]^*R2+63\{[-1]^*S0+16^*S1+ \\ 4^*S2+[-4]^*S3+[-2]^*S4+[-132]^*S5+[-2]^*S7+ \\ 1^*R1+7\{64^*S3+4^*S6+[-14]^*R3\}\} \quad (3a),$$

where recursive subexpressions for the given equation are:

$$R1=1^*S8+2^*S9,\ R2=2^*S3+1^*S7,\ R3=1^*S2+[-8]^*S4.$$

The number of adders obtained after optimization 1 in the above equation is 29. The coefficient equation (3a) can also be written as equation (3b).

$$Y=RE1+63(RE2+7(QO2)) \quad (3b);$$

where expressions, $$RE1=[-16]^*S0+36^*S1+32^*S2+96^*S4+[-66]^*S5+ \\ [-136]^*S6+[-28]^*R2 \quad (3c1),$$

$$RE2=[-1]^*S0+16^*S1+4^*S2+[-4]^*S3+[-2]^*S4+ \\ [-132]^*S5+[-2]^*S7+1^*R1 \quad (3c2),$$

$$QO2=64^*S3+4^*S6+[-14]^*R3 \quad (3c3), \text{ and recursive subexpression in expressions (3c1, 3c2, 3c3) are}$$

$$R1=1^*S8+2^*S9,\ R2=2^*S3+1^*S7,\ R3=1^*S2+[-8]^*S4.$$

The resultant structure after the optimization 1 from equation (3b) is shown in FIG. 3($b1$). The input X, of the filter is given to the plurality of unit sample delays (11) resulting in signals S0 to S9. These signals are given to a group of substructures that are defined for the following input/output parameters:

(a) Substructure SS [R1] with inputs S8, S9 results in signal R1
(b) Substructure SS[R2] with inputs S7, S3 results in signal R2
(c) Substructure SS[R3] with inputs S2, S4 results in signal R3,
(d) Substructure SS[RE1] with inputs S0, S2, S4, R2, S1, S6, S5, results in signal RE1,
(e) Substructure SS[RE2] with inputs S0, S4, S7, S2, S3, R1, S1, S5 results in signal RE2,
(f) Substructure SS[QO2] with inputs S3, S6, R3 results in signal QO2;
(g) Substructure SS[Y] with inputs, RE1, RE2, QO2 results in output Y of the direct form of FIR filter, the group of substructures formed from plurality of adders (13,15) and shifters (14) is called direct form of coefficient bank (1).

Note: After the end of optimization 1 the remainder and quotient expressions contain only 0's, power of 2's, cost1's.

Optimization 2 (Vertical Optimization):

The table formed from the quotient expression, and remainder expressions is scanned column wise for the possibility of taking cost1 coefficients as the common subexpression. This would further reduce the total weight of the coefficient equation. This optimization is explained with the quotient and remainder expressions of an example as follows.

The coefficient equation of the example in consideration after optimization 1 is Equation (3a) as given below:

$$Y=[-16]^*S0+36^*S1+32^*S2+96^*S4+[-66]^*S5+ \\ [-136]^*S6+[-28]^*R2+63\{[-1]^*S0+16^*S1+ \\ 4^*S2+[-4]^*S3+[-2]^*S4+[-132]^*S5+[-2]^*S7+ \\ 1^*R1+7\{64^*S3+4^*S6+[-14]^*R3\}\} \quad (3a);$$

where recursive subexpressions are $R1=1^*S8+2^*S9$, $R2=2^*S3+1^*S7$, $R3=1^*S2+[-8]^*S4$, Step 8: separate the remainder and quotient expressions in the coefficient equation. Equation (3a) can also be written as $$Y=RE1+63(RE2+7(QO2)) \quad (3b)$$

where quotient (QO2) and remainder expressions (RE1, RE2) are $$RE1=[-16]^*S0+36^*S1+32^*S2+96^*S4+[-66]^*S5+ \\ [-136]^*S6+[-28]^*R2 \quad (3c1)$$

$$RE2=[-1]^*S0+16^*S1+4^*S2+[-4]^*S3+[-2]^*S4+ \\ [-132]^*S5+[-2]^*S7+1^*R1 \quad (3c2)$$

$$QO2=64^*S3+4^*S6+[-14]^*R3 \quad (3c3)$$

Step 9: Find the vertical subexpressions in the table formed from the separated quotient and remainder expressions by traversing the table column wise, looking for common odd fundamental cost 1s. Forming a table from the quotient (3c3) and remainder (3c1, 3c2) expressions for the given example. By writing coefficients in each equation column wise under respective signals into a table as shown in Table 4.

TABLE 4

Expressions RE1, RE2, QO2 in form of a table

| | S0 | S1 | S2 | S3 | S4 | S5 | S6 | S7 | R1 | R2 | R3 |
|---|---|---|---|---|---|---|---|---|---|---|---|
| RE1 | -16 | 4 * 9 | 32 | | 32 * 3 | -2 * 33 | -8 * 17 | | | -4 * 7 | |
| RE2 | -1 | 16 | 4 | -4 | -2 | -4 * 33 | | -2 | 1 | | |
| QO2 | | | | 64 | | | 4 | | | | -2 * 7 |

In Table 4, column 7 has the subexpression −2*33 and subexpression −4*33, the odd fundamental for both of these subexpressions is 33. Hence, instead of calculating 33 twice we can calculate it only once by taking 33*S5 as vertical subexpression. This is called vertical subexpression as we are taking the common odd fundamental column wise in the table. The example coefficient equation (3b) after substituting the vertical subexpression results in equation 3(f):

$$Y=[-16]*S0+36*S1+32*S2+96*S4+[-2]*Y1+[-136]\\*S6+[-28]*R2+63\{[-1]*S0+16*S1+4*S2+[-4]\\*S3+[-2]*S4+[-4]*Y1+[-2]*S7+1*R1+\\7\{64*S3+4*S6+[-14]*R3\}\} \quad (3f);$$

where Y1=33*S5,
The equation (3f) can be rewritten as follows:

$$Y=RE1+63(RE2+7(QO2)) \quad (3g),$$

where $RE1=[-16]*S0+36*S1+32*S2+96*S4+[-2]\\*Y1+[-136]*S6+[-28]*R2$ $RE2=[-1]*S0+16*S1+4*S2+[-4]*S3+[-2]*S4+[-4]\\*Y1+[-2]*S7+1*R1$ $QO2=64*S3+4*S6+[-14]*R3,$ It is observed that the number of adders in the coefficient equation (3f) after optimizations 2 are 28.

The structure obtained after the optimization 2 (equation (3g)) is illustrated in FIG. 3(b2). The input X of the filter is given to the plurality of unit sample delays (11) resulting in signals S0 to S9, these signals are given to a group of substructures that operate for the following input-output parameters:

(a) Substructure SS [R1] with inputs S8, S9 results in signal R1,
(b) Substructure SS[R2] with inputs S7, S3 results in signal R2,
(c) Substructure SS[R3] with inputs S2, S4 results in signal R3,
(d) Substructure SS[Y1] with inputs S5 results in signal Y1,
(e) substructure SS[RE1] with inputs S0, S2, S4, R2, S1, S6, Y1 results in signal RE1,
(f) ub-structure SS[RE2] with inputs S0, S4, S7, S2, S3, R1, S1, Y1 results in signal RE2, substructure SS[QO2] with inputs S3, S6, R3 results in signal QO2;
(g) substructure SS[Y] with inputs RE1, RE2, QO2 results in output Y of the direct form of FIR filter, the group of substructures formed from plurality of adders (13,15) and shifters (14) is called direct form of coefficient bank (1).

Optimization 3 (Horizontal Optimization):
Step 10: Expand cost 1s coefficients in to quotient, and remainder expressions and vertical subexpression as (2^z+1) or (2^z−1) where 'z' is a positive number.
The resultant coefficient equation for the example is as given below:

$$Y=\{32*S1+4*S1+32*S2+128*S4+[-128]*S6+[-8]\\*S6+[-32]*R2+4*R2+[-2]*Y1+[-16]*S0+[-32]\\*S4+63\{16*S1+4*S2+[-4]*S3+[-2]*S7+[-4]\\*Y1+[-1]S0+[-2]*S4+R1+7\{64*S3+4*S6+[-16]\\*R3+2*R3\}\}\} \quad (3h)$$

or $$Y=RE1+63(RE2+7(QO2)) \quad (3i)$$

where expression $RE1=32*S1+4*S1+32*S2+128*S4+\\[-128]*S6+[-8]*S6+[-32]*R2+4*R2+[-2]*Y1+\\[-16]*S0+[-32]*S4, RE2=16*S1+4*S2+[-4]\\*S3+[-2]*S7+[-4]*Y1+[-1]S0+[-2]*S4+R1$ $QO2=64*S3+4*S6+[-16]*R3+2*R3.$ The resultant structure after the optimization 2 from equation (3i) is shown in FIG. 3(b3). The input X of the filter is given to plurality of unit sample delays (11) resulting in signals S0 to S9, these signals are given to a group of substructures, substructure SS [R1] with inputs S8, S9 results in signal R1, substructure SS [R2] with inputs S7, S3 results in signal R2, substructure SS [R3] with inputs S2, S4 results in signal R3, substructure SS [Y1] with inputs S5 results in signal Y1, substructure SS[RE1] with inputs S0, S2, S4, R2, S1, S6, Y1 results in signal RE1, substructure SS[RE2] with inputs S0, S4, S7, S2, S3, R1, S1, Y1 results in signal RE2, substructure SS[QO2] with inputs S3, S6, R3 results in signal QO2; substructure SS[Y] with inputs RE1, RE2, QO2 results in output Y of the direct form of FIR filter, the group of substructures formed from plurality of adders (13,15) and shifters (14) is called direct form of coefficient bank (1).

Step 11: Find the optimal horizontal subexpressions in the table formed from separated quotient and remainder expressions by traversing the table row wise and looking for common horizontal subexpressions, there is possibility of overlap in the horizontal subexpressions so choose the best horizontal subexpressions which reduce the total weight of the coefficient equation to the lowest as possible. The quotient expressions (QO2) and remainder expression (RE1, RE2) as given in equation (3i) in table form are in Table 5.

TABLE 5

Expression RE1, RE2 and QO2 after step 10 expressed in the tabular form as follows:

| | S0 | S1 | S2 | S3 | S4 | S5 | S6 | S7 | R1 | R2 | R3 | Y1 |
|---|---|---|---|---|---|---|---|---|---|---|---|---|
| RE1 | -16 | 32 + 4 | 32 | | 128 -32 | | -128 - 8 | | | -32 + 4 | | -2 |
| RE2 | -1 | 16 | 4 | -4 | -2 | | | -2 | 1 | | | -4 |
| QO2 | | | | 64 | | | 4 | | | | -16 + 2 | |

In table 5 the subexpression −16*S0−32*S4 of row2 and subexpression −S0−2*S4 of row3 can be treated as single subexpression 'S0+2*S4'. This is called horizontal subexpressions as we are selecting common subexpression across the rows of the table. There are no overlaps for the given table. The resultant coefficient equation obtained after optimization 3 for the example is:

$$Y=\{32*S1+4*S1+32*S2+128*S4+[-128]*S6+[-8]\\*S6+[-32]*R2+4*R2+[-2]*Y1+[-16]*X1+\\63\{[-1]*X1+[-2]*S7+4*S2+[-4]*S3+16*S1+\\R1+[-4]*Y1+7\{4*S6+2*R3+64*S3+[-16]\\*R3\}\}X$$

or $$Y=RE1+63(RE2+8QO2-QO2) \quad (3h)$$

where expressions $RE1=32*S1+4*S1+32*S2+128*S4+[-128]*S6+[-8]*S6+[-32]*R2+4*R2+[-2]*Y1+[-16]*X1$ $RE2=[-1]*X1+[-2]*S7+4*S2+[-4]*S3+16*S1+R1+[-4]*Y1$ $QO2=4*S6+2*R3+64*S3+[-16]*R3$ Equation (3h) can further be simplified and written as:

$$Y=RE1+64(RE2+8QO2-QO2)-(RE2+8QO2-QO2) \quad (3i),$$

The number of adders after all the three optimizations is 27. The resultant structure after the three optimizations (from equation (3i)) is shown in FIG. 3(b4). The input X of the filter is given to the plurality of unit sample delays (11) resulting in signals S0 to S9, these signals are given to a group of sub-structures, substructure SS[R1] with inputs S8, S9 results in signal R1, substructure SS[R2] with inputs S7, S3 results in signal R2, substructure SS[R3] with inputs S2, S4 results in signal R3, substructure SS[Y1] with inputs S5 results in signal Y1, substructure SS[X1] with inputs S0, S4 results in signal X1, substructure SS[RE1] with inputs X1, S2, R2, S1, S6, Y1 results in signal RE1, substructure SS[RE2] with inputs X1, S7, S2, S3, R1, S1, Y1 results in signal RE2, substructure SS[QO2] with inputs S3, S6, R3 results in signal QO2; substructure SS[Y] with inputs RE1, RE2, QO2 results in output Y of the direct form of FIR filter, the group of substructures formed from plurality of adders (13,15) and shifters (14) is called the direct form of coefficient bank (1).

Generalized Structure Depicting the Minimal Area Integrated Circuit Implementation of the Sum of Products Expression:

The generalized structure is shown in FIG. 3(a3) to map the results of the algorithm, the generalized structure contains taps S0 to Sn from the plurality of unit sample delays (11) connected to a group of substructures SS[R1] to SS[Ro] with inputs S0 to Sn each generating plurality of signals R1 to Ro. The substructures SS[Y1] to SS[Yp] with inputs S0 to Sn, generate a plurality of signals Y1 to Yp, where p is any positive number; substructures SS[X1] to SS[Xq] with inputs S0 to Sn, R1 to Ro and Y1 to Yp each generating signals X1 to Xq, where q is any positive number, substructures SS[QO1m] . . . SS[RE1m . . . ] with inputs S0 to Sn, R1 to Ro, Y1 to Yp and X1 to Xq generating signals QO1m . . . RE1m etc., and substructure SS[Y] formed from inputs QO1m to RE1m generating output Y, these substructures contain a plurality of adders (13, 15) and shifter 14, these substructures are connected together to form a direct form of FIR filter or IIR filter.

The invented method for direct form implementation of the coefficient bank can be used to implement a single number also. This is done by giving a single number at the input of the algorithm in FIG. 3(a1). A single number given to the algorithm would result in a optimized shift and add hardware structure of the number.

Method for implementation of sum of products expression to thereby implement the transposed form of coefficient bank: (An embodiment of the instant invention).

The algorithm involved in the reduction of the number of adders required to implement the coefficient set is shown in FIGS. 3(c1) and 3(c1)-1. This algorithm is explained with the help of generalized equations in FIG. 3(c2). Part 2 of the method is a generalized structure to map the results obtained from the algorithm as shown in FIG. 3(c3).

The equations of the individual coefficients in transposed form of coefficient bank for the example are:

$S1=1044X, S2=-5890X, S3=27916X, S4=49362X,$
$S5=-8382x, S6=1628X, S7=-154X, S8=63X,$
$S9=126X$

The following discussion is about the optimization of the coefficients for transposed form of coefficient bank for the example using the algorithm in FIG. 3(c1).

Step 1: Decompose the coefficient set into odd fundamentals and multiplication factor set:

{coefficient set}={odd fundamental set}* {multiplication factor set}

(Each coefficient is divided with 2 till it is odd, when it is odd, magnitude of odd number is moved to odd fundamental set. The number of 2's with which each coefficient is divided is moved into the multiplication factor set along with the sign of the coefficient).

Example coefficient set decomposes as follows:

{−79,1044,−5890,27916,49362,−8382,1628,−154,63, 126}={79,261,2945,6979,24681,4191,407,77,63, 63}*{−1,4,−2,4,2,−2,4,−2,1,2}, where {coefficient set}={−79,1044,−5890,27916, 49362,−8382,1628,−154,63,126}, {odd fundamental set}={79,261,2945,6979,24681, 4191,407,77,63,63}

{multiplication factor set}={−1,4,−2,4,2,−2,4,−2,1,2}.

Step 2: Check if all the elements of the odd fundamental set has all cost 1s and 1s as odd fundamentals. If yes implement cost 1 odd fundamental as $2^z+1$ or $2^z-1$, where z=ceil (log 2(odd fundamental)), and use cost1 to implement coefficients and 'exit', else proceed to step 3. In the example odd fundamental set has only one cost 1 coefficient (63), and rest all are higher cost numbers, hence proceed to step 3.

Step 3: Check if odd fundamental set has cost 1 odd fundamentals. If yes proceed to step 4, else proceed to step 5. In the example odd fundamental set has '63' which is the cost1 odd fundamental. Hence proceed to step 4.

Note: Cost1 odd fundamental is computed as follows:

prec_of_number=ceil(log 2(odd fundamental)).

If at any stage, odd fundamental=$2^z+1$ or $2^z-1$, z varying from 1 to prec_of_number, then that odd fundamental is cost 1.

Step 4: Decompose 'odd fundamental set' into 'graph set' and 'incomplete set', ('graph set' includes cost 1 odd fundamentals from the odd fundamental set, these cost1 odd fundamentals are implemented in a graph as $2^z+1$ or $2^z-1$, where z=ceil (log 2(odd fundamental))), ('incomplete set' includes unimplemented odd fundamentals).

For the given example the odd fundamental set {79,261, 2945,6979, 24681, 4191, 407, 77,63,63} is decomposed to {63} and {79,261,2945,6979,24681,4191,407,77}; where graph set={63}, 63 is implemented in graph as $(2^6)-1$. The signals S8 and S9 are obtained as $S8=((2^6)-1)X$, $S9=(2^1)*((2^6)-1)X$, where coefficients $63=((2^6)-1)$ & $126=(2^1)*((2^6)-1)$, incomplete set={79, 261,2945,6979, 24681, 4191, 407, 77}.

Step 5: Form the 'incomplete set' from the odd fundamentals greater than 1. When it is found in step 3 that there are no cost1 odd fundamentals, then there is no 'graph set'. All numbers in the odd fundamental set which are greater than 1 are moved to the 'incomplete set'. In the example under consideration step 5 is not applicable at this stage.

Step 6: Determine the cost and coefficient equation of the numbers in the incomplete set using the algorithm in FIG. 3($a$1) and make a look up table with the cost and coefficient equation. Use the algorithm in FIG. 3($a$1) with each number of the incomplete set separately to obtain the coefficient equation, 'cost of implementation of a number in incomplete set' (cost)=cost of implementation of each number in coefficient equation+number of adders or subtractors in the coefficient equation.

The incomplete set for the example is {79,261,2945,6979, 24681, 4191, 407, 77}, the cost & coefficient equation of each number in incomplete set found from the algorithm in FIG. 3($a$1) is in look up table (Table 6).

TABLE 6

Cost & coefficient equation of each number in incomplete set:

| Number | Cost | Coefficient equation |
|---|---|---|
| 79 | 2 | 63 + 16 |
| 261 | 2 | 257 + 4 |
| 2945 | 3 | 2049 + 896 |
| 6979 | 4 | 7[−124 + 257(16)] |
| 24681 | 3 | 1023(24) + 127 |
| 4191 | 2 | 127 * 33 |
| 407 | 3 | 3(136) − 1 |
| 77 | 3 | −12 + 65(−1) |

The look up table is obtained using the algorithm of FIG. 3($a$1) with each number processed by the algorithm separately, for example number 79 when processed by the algorithm of FIG. 3($a$1) that gives common factor 63 with remainder as 16. The cost of implementation of 79 is 2. Since 63 is a cost1 number and there is a '+' to add 63 and 16. Hence it is noted in the look up table 6 shows that 79 has cost of '2' and coefficient equation of 79 is '63+16'. Similarly for all the other numbers in the incomplete set the coefficient equation and cost are noted in Table 6.

Step 7: Check if the adder distance* for the smallest cost, smallest magnitude number (found from look up table formed in step 6) in the incomplete set is 1. If yes proceed to step 8 else it means the adder distance is greater than 1 or it is not possible to implement the number from the graph set and proceed to step 9.

*Adder Distance:

Adder distance 1 of the selected number from the incomplete set=fundamental coefficients from the existing graph set+a power of 2.

For the example incomplete set={79,261,2945,6979, 24681, 4191, 407, 77}, the smallest cost, smallest magnitude number in the incomplete set from Table 6 is '79', 79 has the adder distance '1' as '79'=63 (existing fundamental from the graph set)+16.

Step 8: Use the graph set to implement the selected number (from step 7) in the 'incomplete set' and remove the number from the 'incomplete set' and move it to the 'graph set'. For the given example the number 79 has an adder distance '1' hence it is implemented in the form of the graph as '63+16' (with '−1' at the end of the structure as coefficient is −79), and 79 is removed from 'incomplete set' and is added to the 'graph set'. Now the graph set={63,79}, the incomplete set={261, 2945,6979, 24681, 4191, 407, 77}, now move to step 10.

Step 9: Use the coefficient equation in the look up table obtained in step 6 to implement the number in the incomplete set and add the odd fundamentals in the coefficient equation into the graph set. For the example in step 7 it is found that the number 79 has an adder distance 1. If the number to be implemented has an adder distance more than 1 then the implementation of the coefficient '79' can be searched from the look up table.

Step 10: Check, whether the incomplete set is Null if yes exit, if not go to the step 7. For the example as the incomplete set {261,2945,6979, 24681, 4191, 407, 77} is not a null set then go to step 7 with the incomplete set. For the example step 7 select 261 as next number to be implemented, and the adder distance for the number '261' is neither 1 nor 2. Hence step 9 is invoked and the implementation in look up table 6 for the number 261 i.e., (257+4)(with 4 at the end of the structure as coefficient is 4*261=1044) is taken, and the odd fundamental 257 and 261 are added to the graph.

The implementation of remaining numbers in incomplete set of the example using the step 7 to step 10 of algorithm in FIG. 3($c$1) results in equations as follows, $$S1=1044X=16+(257)*4$$

$$S2=-5890X=-(7)*256+(-2)*(2049)$$

$$S3=27916X=(7)*((-124)+(257)*16)$$

$$S4=49362X=(258)+(1023)*(48)$$

$$S5=-8382X=(127)*(-66)$$

$$S6=1628X=-4+(17)(96)$$

$$S7=-154X=(79-2)*(-2)$$

FIG. 3($c$3) shows the generalized structure for the transposed form of the coefficient bank, where the structure has a plurality of substructures SS [S0], SS[S1] . . . SS[Sn]. SS[S0] has X as input and S0 as the output, SS[S1] has A and X as the input and S1 as output. The substructures are formed from adders (13,15) (adders or subtractors are referred as adders for the ease of explanation), shifter (14), to form the transposed form of coefficient bank (2). The taps obtained from the structure of the individual coefficient equations are connected to the unit sample delays (11) to form the transposed form of FIR/IIR filter.

The number of adders required to implement the graph for the example in FIG. 3($d$) is 18. The resultant graph structure for all the coefficients of the example for the transposed form of the coefficient bank (2) is shown in FIG. 3($d$). This structure is formed from the plurality of the adders (13,15) and the shifter (14) connected together depending on coefficients. Part 2 of the method is the generalized structure formed from the algorithm in part 1, the structure has plurality of substructures SS[S0], SS[S1] . . . SS[Sn], where SS[S0] has X as input and S0 as output, SS[S1] has A and X as the input and S1 as the output etc., the substructures are formed from adders (13,15), shifter 14, to form the transposed form of the coefficient bank (2), the taps obtained from structure of the individual coefficient equations are connected to unit sample delays (11) to form a transposed form of FIR filter or IIR filter.

Advantages of the Method:

The number of adders using the CSD based method and the system to implement the example coefficient bank are tabulated in Table 7.

TABLE 7

Number of adders using CSD based method and invented method to implement the example coefficient bank:

|  | Existing (CSD) | Invented |
|---|---|---|
| Direct | 34 | 27 |
| Transposed | 20 | 18 |

It is evident from the above table that the invented method has less number of adders compared to existing method in implementation of direct and transposed form of coefficient bank. Thus, it is observed that the instant invention provides a minimal area implementation of a sum of products expression.

That which is claimed is:

1. A device for implementing a sum-of-products expression comprising:
    a first set of 2-input Shift-and-Add (2SAD) circuits comprising respective taps for receiving a first set of coefficients for generating a first set of partially optimized expression terms by removing repeated odd fundamental coefficients and applying recursion therein to generate a reduced area sum-of-products implementation;
    a second set of 1-input Shift-and-Add (1SAD) circuits comprising respective taps for receiving a second set of coefficients obtained as a subset of the first set of coefficients for generating a second set of partially optimized expression terms by applying vertical optimization therein;
    a third set of 2SAD circuits comprising respective taps for receiving a combination of a third set of the coefficients, comprising respective taps for receiving a first subset of the first set of partially optimized expression terms and comprising respective taps for receiving a first subset of the second set of partially optimized expression terms as inputs, for generating a third set of partially optimized expression terms by applying horizontal optimization;
    a fourth set of 2SAD circuits comprising respective taps for receiving a combination of a fourth set of the coefficients, comprising respective taps for receiving a second subset of the first set of partially optimized expression terms, comprising respective taps for receiving a second subset of the second set of partially optimized expression terms, and comprising respective taps for receiving a first subset of the third set of partially optimized expression terms as inputs, for generating a fourth set of partially optimized expression terms by applying decomposition and factorization therein; and
    a fifth set of 2SAD circuits comprising respective taps for receiving the fourth set of partially optimized expression terms for providing an output.

2. The device according to claim 1, further comprising a plurality of unit sample delays to generate the first set of coefficients based upon an input signal.

3. The device according to claim 1, wherein each of said 2SAD circuits comprise:
    a plurality of two input adders receiving a respective set of coefficients at a first input;
    a plurality of bit shifters connected at a second input for providing a shifted response of the respective set of coefficients; and
    an adder cooperating with said plurality of adders and shifters to output a respective partially optimized expression term.

4. The device according to claim 1, wherein said 1SAD circuits comprise at least one 2-input adder having a first input connected to the second set of coefficients, and a second input receiving a bit shifted response of the second set of coefficients.

5. The device according to claim 1, further comprising a set of logic circuits receiving an input signal, said set of logic circuits based upon application of an optimizer to the first set of coefficients for generating coefficients corresponding to a $2^n (+/-) 1$ implementation or as a result of applying the optimizer in combination with said recursive, vertical and horizontal optimization, for thereby generating an implementation of a second-sum-of products expression.

6. The device according to claim 5, wherein said 1SAD circuits receive the input signal for providing an intermediate signal; and wherein said set of logic comprises:
    a plurality of nSAD circuits receiving the intermediate signal and the input signal for producing a first plurality of coefficient values; and
    a plurality of bit shifters receiving said first plurality of coefficient values for generating a shifted response.

7. The device according to claim 6, wherein said plurality of nSAD circuits comprise:
    a shifter for receiving the input signal and providing a single bit shifted response of the input signal;
    a plurality of two input adders connected to each other for performing at least one of receiving the bit shifted response at a first input, receiving the intermediate signal, and receiving an output from a preceding adder for outputting the first plurality of coefficient values; and
    wherein said plurality of shifters and adders converge to generate the first plurality of coefficient values; and
    wherein the first plurality of coefficient values are a plurality of intermediate signals inputted to said plurality of two input adders.

8. The device according to claim 6, further comprising a plurality of unit sample delay circuits receiving the shifted response for generating the second sum-of-products expression for implementing a transposed form of coefficient bank expression for a digital filter realization.

9. The device according to claim 1, wherein the sum-of-products expression comprises a direct form of coefficient bank expression for the digital filter realization.

10. A computing system for implementation of a sum-of-products expression comprising:
    a first circuit comprising at least one 2-input Shift-and-Add (2SAD) circuit to optimize a first set of coefficients received at respective taps by removing repeated odd fundamental coefficients and performing recursion to generate a first set of partially optimized expression terms;
    a second circuit comprising at least one 1-input Shift-and-Add (1SAD) circuit to perform vertical optimization on a second set of coefficients received at respective taps and obtained as a subset of the first set of coefficients, to generate a second set of partially optimized expression terms;
    a third circuit comprising at least one 2-input Shift-and-Add (2SAD) circuit to perform horizontal optimization on a third set of coefficients received at respective taps and first subsets of said first and second sets of partially optimized expression terms received at respective taps to generate a third set of partially optimized expression terms;

a fourth circuit comprising at least one 2-input Shift-and-Add (2SAD) circuit to perform decomposition and factorization on a fourth set of coefficients received at respective taps, second subsets of the first and second sets of partially optimized expression terms received at respective taps, and a first subset of the third set of partially optimized expression terms received at respective taps to generate a fourth set of partially optimized expression terms; and a fifth circuit comprising at least one 2-input Shift-and-Add (2SAD) circuit for receiving the fourth set of partially optimized expression terms for providing an output.

11. The computing system according to claim 10, wherein said first circuit comprises a first optimizer for generating coefficients/numbers corresponding to a $2^n (+/-) 1$ implementation.

12. The computing system according to claim 11, wherein said second circuit comprises a second optimizer for applying factorization to the second set of coefficients to generate at least one vertical subexpression.

13. The computing system according to claim 12, wherein said third circuit comprises a third optimizer for applying factorization to the third set of coefficients to generate at least one horizontal subexpression.

14. The computing system according to claim 13, wherein said fourth circuit comprises a fourth optimizer for generating the output.

15. The computing system according to claim 13, further comprising an optimization circuit selectively coupled to said first, second, third optimizers for generating a second sum-of-products expression.

16. The computing system according to claim 15, wherein said optimization circuit comprises:
 a decomposition circuit for generating coefficients/numbers corresponding to a $2^n (+/-) 1$ implementation and coefficients that do not correspond to a $2^n(+/-) 1$ implementation;
 a factorization circuit for applying the first, second, third optimizer to coefficients that do not correspond to the $2^n(+/-) 1$ implementation, to generate coefficients/numbers corresponding to the $2^n(+/-) 1$ implementation and coefficients/numbers corresponding to a power of two; and
 a selection circuit for selecting a minimal factor from an output obtained from said factorization circuit to generate the second sum of products expression.

17. The computing system according to claim 10 further comprising the following for implementing said first through fourth circuits:
 a central processing unit;
 a memory associated with said central processing unit; and
 at least one input/output device associated with said central processing unit.

18. A method for operating a device for implementing a sum of products expression, comprising:
 receiving at a first set of 2-input Shift-and-Add (2SAD) circuits comprising respective taps a first set of coefficients for generating a first set of partially optimized expression terms by removing repeated odd fundamental coefficients and applying recursion therein to generate a reduced area sum-of-products implementation;
 receiving at a second set of 1-input Shift-and-Add (1SAD) circuits comprising respective taps a second set of coefficients obtained as a subset of the first set of coefficients for generating a second set of partially optimized expression terms by applying vertical optimization therein;
 receiving at a third set of 2SAD circuits comprising respective taps a combination of a third set of the coefficients, the third set of 2SAD circuits comprising respective taps for receiving a first subset of the first set of partially optimized expression terms and respective taps for receiving a first subset of the second set of partially optimized expression terms as inputs, for generating a third set of partially optimized expression terms by applying horizontal optimization;
 receiving at a fourth set of 2SAD circuits comprising respective taps a combination of a fourth set of the coefficients, the fourth set of 2SAD circuits further comprising respective taps for receiving a second subset of the first set of partially optimized expression terms, respective taps for receiving a second subset of the second set of partially optimized expression terms, and respective taps for receiving a first subset of the third set of partially optimized expression terms as inputs, for generating a fourth set of partially optimized expression terms by applying decomposition and factorization therein; and
 receiving at a fifth set of 2SAD circuits comprising respective taps the fourth set of partially optimized expression terms for providing an output.

19. The method according to claim 18, further comprising using a plurality of unit sample delays to generate the first set of coefficients based upon an input signal.

20. The method according to claim 18, wherein each of the 2SAD circuits comprise:
 a plurality of two input adders receiving a respective set of coefficients at a first input;
 a plurality of bit shifters connected at a second input for providing a shifted response of the respective set of coefficients; and
 an adder cooperating with the plurality of adders and shifters to output a respective partially optimized expression term.

21. The method according to claim 18, wherein the 1SAD circuits comprise at least one 2-input adder having a first input connected to the second set of coefficients, and a second input receiving a bit shifted response of the second set of coefficients.

22. The method according to claim 18, further comprising receiving at a set of logic circuits an input signal, the set of logic circuits based upon application of an optimizer to the first set of coefficients for generating coefficients corresponding to a $2^n (+/-) 1$ implementation or as a result of applying the optimizer in combination with the recursive, vertical and horizontal optimization, for thereby generating an implementation of a second-sum-of products expression.

23. The method according to claim 22, wherein the 1SAD circuits receive the input signal for providing an intermediate signal; and wherein the set of logic comprises:
 a plurality of nSAD circuits receiving the intermediate signal and the input signal for producing a first plurality of coefficient values; and
 a plurality of bit shifters receiving the first plurality of coefficient values for generating a shifted response.

24. The method according to claim 23, wherein the plurality of nSAD circuits comprise:
 a shifter for receiving the input signal and providing a single bit shifted response of the input signal;
 a plurality of two input adders connected to each other for performing at least one of receiving the bit shifted response at a first input, receiving the intermediate signal, and receiving an output from a preceding adder for outputting the first plurality of coefficient values; and wherein the plurality of shifters and adders converge to generate the first plurality of coefficient values; and wherein the first plurality of coefficient values are a plurality of intermediate signals inputted to the plurality of two input adders.

25. The method according to claim 23, further comprising a plurality of unit sample delay circuits receiving the shifted response for generating the second sum-of-products expression for implementing a transposed form of coefficient bank expression for a digital filter realization.

26. The method according to claim 18, wherein the sum-of-products expression comprises a direct form of coefficient bank expression for the digital filter realization.

* * * * *

UNITED STATES PATENT AND TRADEMARK OFFICE
CERTIFICATE OF CORRECTION

PATENT NO. : 7,917,569 B2  
APPLICATION NO. : 11/254935  
DATED : March 29, 2011  
INVENTOR(S) : Bhuvanagiri et al.

Page 1 of 1

It is certified that error appears in the above-identified patent and that said Letters Patent is hereby corrected as shown below:

Column 3, Line 4  Delete: "[S3]"  
Insert: --[63]--

Column 4, Line 65  Delete: "(2^-2^6)"  
Insert: --(2^0-2^6)--

Column 5, Line 39  Delete: "S4 = 49362X = ((Y3-(2^5)*(Y2)+(2^13) *(Y2))*(2^2))X"  
Insert: --S4 = 49362X = ((Y3-(2^5)*(Y2)+(2^13) *(Y2))*(2^1))X--

Column 9, Line 10  Delete: "((2 z)"  
Insert: --((2^z)--

Column 9, Line 46  Delete: "Y=$b_0$ *S0 + $b_1$ *S1 + $b_2$ * S2 +.........+ $b_n$*Sn,"  
Insert: --Y=$b_0$ *S0 + $b_1$ *S1 + $b_2$ * S2 +.........+ $b_n$*Sn,--

Column 12, Line 37  Delete: "{S1, S1, S5, S8}"  
Insert: --{S0, S1, S5, S8}--

Column 13, Line 20  Delete: "{$cf_{32}$...}+RE"  
Insert: --{$cf_{32}$...)...}+RE--

Signed and Sealed this  
Twenty-eighth Day of August, 2012

David J. Kappos  
*Director of the United States Patent and Trademark Office*